(12) United States Patent
Han et al.

(10) Patent No.: US 12,543,448 B2
(45) Date of Patent: Feb. 3, 2026

(54) DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Cheng Han, Beijing (CN); Kaijia Jin, Beijing (CN); Xing Fan, Beijing (CN); Yanming Wang, Beijing (CN); Qixiao Wu, Beijing (CN); Xiangmin Wen, Beijing (CN); Bingwei Yang, Beijing (CN); Shun Wang, Beijing (CN); Songquan Wu, Beijing (CN); Yansong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 424 days.

(21) Appl. No.: 18/025,735

(22) PCT Filed: Apr. 24, 2022

(86) PCT No.: PCT/CN2022/088685
§ 371 (c)(1),
(2) Date: Mar. 10, 2023

(87) PCT Pub. No.: WO2023/205920
PCT Pub. Date: Nov. 2, 2023

(65) Prior Publication Data
US 2024/0292665 A1    Aug. 29, 2024

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/876* (2023.02)

(58) Field of Classification Search
CPC ............. H10K 59/122; H10K 59/1201; H10K 59/876; H10K 50/80; H10K 50/856; H10K 59/00; H10D 99/00
See application file for complete search history.

(56) References Cited

U.S. PATENT DOCUMENTS

| | | |
|---|---|---|
| 2014/0034919 A1 | 2/2014 | Park et al. |
| 2014/0042402 A1 | 2/2014 | Prushinskiy et al. |

(Continued)

FOREIGN PATENT DOCUMENTS

| | | |
|---|---|---|
| CN | 103579284 A | 2/2014 |
| CN | 109216581 A | 1/2019 |

(Continued)

*Primary Examiner* — Elmito Breval
(74) *Attorney, Agent, or Firm* — The Webb Law Firm

(57) ABSTRACT

Provided are a display panel and a manufacturing method thereof and a display device. The display panel includes: a base substrate; a pixel defining layer including first openings defining sub-pixels; an encapsulation layer; and a light modulation layer. The light modulation layer is configured such that light from each of at least one sub-pixel propagates along a direction away from the base substrate after total reflection upon incidence on an interface between the first light modulation portion in a corresponding second opening and the first light modulation sub-layer. The display panel satisfies at least one of a first condition or a second condition. The first condition is that at least a part of edge of the first orthographic projection has a recess. The second condition is that at least a part of edge of the second orthogonal projection has at least one of a recess or a protrusion.

19 Claims, 19 Drawing Sheets

(56) References Cited

U.S. PATENT DOCUMENTS

| | | |
|---|---|---|
| 2019/0013495 A1 | 1/2019 | Kim et al. |
| 2019/0348458 A1 | 11/2019 | Jangjian et al. |
| 2020/0303466 A1 | 9/2020 | Park et al. |
| 2021/0175300 A1 | 6/2021 | Kim et al. |

FOREIGN PATENT DOCUMENTS

| | | |
|---|---|---|
| CN | 110265452 A | 9/2019 |
| CN | 111552095 A | 8/2020 |
| CN | 111599850 A | 8/2020 |
| CN | 111725415 A | 9/2020 |
| CN | 111900190 A | 11/2020 |
| CN | 111952481 A | 11/2020 |
| CN | 212873152 A | 4/2021 |
| CN | 112951885 A | 6/2021 |
| CN | 113097278 A | 7/2021 |
| CN | 113130616 A | 7/2021 |
| CN | 113241364 A | 8/2021 |
| CN | 113328055 A | 8/2021 |
| CN | 113394351 A | 9/2021 |
| CN | 113540190 A | 10/2021 |
| CN | 113725385 A | 11/2021 |
| CN | 215578616 A | 1/2022 |
| CN | 114203934 A | 3/2022 |
| CN | 216145641 U | 3/2022 |
| JP | 2013026067 A | 2/2013 |

(a)        (b)

SRGB pixel arrangement    Real RGB pixel arrangement

Diamond pixel arrangement    Diamond-like pixel arrangement

DISPLAY PANEL AND MANUFACTURING METHOD THEREOF, AND DISPLAY DEVICE

CROSS-REFERENCE TO RELATED APPLICATION

This application is the United States national phase of International Application No. PCT/CN2022/088685, filed on Apr. 24, 2022, the disclosure of which is hereby incorporated by reference in its entirety.

BACKGROUND OF THE INVENTION

Field of the Invention

The present disclosure relates to a display panel and a manufacturing method thereof, and a display device.

Description of Related Art

With the development of the display technology, the organic light-emitting diode (OLED) display panel is more and more extensively applied.

In a display panel, light emitted by a light-emitting device (for example, OLED) in a sub-pixel may pass through a plurality of film layers with different refractive indexes, thereby causing light loss.

SUMMARY OF THE INVENTION

According to one aspect of the embodiments of the present disclosure, provided is display panel. The display panel comprises a base substrate; a pixel defining layer located on one side of the base substrate and having a plurality of first openings for defining a plurality of sub-pixels, wherein the plurality of first openings is in one-to-one correspondence to the plurality of sub-pixels; an encapsulation layer located on one side of the pixel defining layer away from the base substrate; and a light modulation layers located on one side of the encapsulation layer away from the base substrate, and comprising: a first light modulation sub-layer having at least one second opening in one-to-one correspondence to at least one sub-pixel of the plurality of sub-pixels, wherein orthographic projections of a first opening and a second opening which correspond to each of the at least one sub-pixel on the base substrate are a first orthographic projection and a second orthographic projection respectively, and a second light modulation sub-layer comprising a first light modulation portion located in each of the at least one second opening, wherein the light modulation layer is configured such that light from each of the at least one sub-pixel propagates along a direction away from the base substrate after total reflection upon incidence on an interface between the first light modulation portion in the second opening corresponding to each of the at least one sub-pixel and the first light modulation sub-layer; wherein the display panel satisfies at least one of a first condition or a second condition, wherein: the first condition is that at least a part of an edge of the first orthogonal projection has a recess, and the second condition is that at least a part of an edge of the second orthogonal projection has at least one of a recess or a protrusion.

In some embodiments, the at least one sub-pixel comprises a blue sub-pixel.

In some embodiments, the at least one sub-pixel comprises a first sub-pixel, wherein a length of the first sub-pixel along a first direction is greater than a length of the first sub-pixel along a second direction perpendicular to the first direction; and an edge of each of the first orthographic projection and the second orthographic projection corresponding to each of the at least one sub-pixel comprises a first edge and a second edge arranged oppositely along the first direction, and a third edge and a fourth edge arranged oppositely along the second direction, wherein each of the third edge and the fourth edge is adjacent to the first edge and the second edge.

In some embodiments, at least one of the first edge or the second edge of the first orthographic projection of the first sub-pixel has a recess, and the third edge and the fourth edge of the first orthographic projection of the first sub-pixel have no recess. In some embodiments, at least one of the third edge or the fourth edge of the first orthogonal projection of the first sub-pixel has a protrusion.

In some embodiments, at least one of the first edge or the second edge of the second orthogonal projection of the first sub-pixel has a recess.

In some embodiments, at least one of the third edge or the fourth edge of the second orthogonal projection of the first sub-pixel has a protrusion.

In some embodiments, an edge of the second orthogonal projection of the first sub-pixel has no recess and has no protrusion.

In some embodiments, an edge of the first orthographic projection of the first sub-pixel has no recess and has no protrusion, and at least one of the first edge or the second edge of the second orthographic projection of the first sub-pixel has a recess.

In some embodiments, an edge of the first orthographic projection of the first sub-pixel has no recess and has no protrusion, and at least one of the third edge or the fourth edge of the second orthographic projection of the first sub-pixel has a protrusion.

In some embodiments, the plurality of sub-pixels comprises the first sub-pixel, a second sub-pixel and a third sub-pixel configured to emit light of different colors, and a ratio of the length of the first sub-pixel along the first direction to the length of the first sub-pixel along the second direction is greater than a ratio of a length of the second sub-pixel along the first direction to a length of the second sub-pixel along the second direction, and greater than a ratio of a length of the third sub-pixel along the first direction to a length of the third sub-pixel along the second direction.

In some embodiments, the first sub-pixel is a red sub-pixel.

In some embodiments, the second light modulation sub-layer further comprises a second light modulation portion located on one side of the first light modulation portion and the first light modulation sub-layer away from the base substrate, and adjacent to the first light modulation portion, wherein each of the first light modulation portion and the second light modulation portion comprises a first surface and a second surface arranged oppositely, and a third surface and a fourth surface arranged oppositely, the second surface is located on one side of the first surface away from the base substrate, each of the third surface and the fourth surface is adjacent to the first surface and the second surface, and a first comprised angle between each of the third surface and the fourth surface of the second light modulation portion and the first surface of the second light modulation portion is smaller than 90 degrees; and the light modulation layer further comprises a third light modulation sub-layer located on one side of the first light modulation sub-layer and the second light modulation sub-layer away from the base substrate, wherein a refractive index of the third light modulation sub-layer is smaller than a refractive index of the second light modulation portion.

In some embodiments, the first comprised angle is greater than or equal to 60 degrees.

In some embodiments, a second comprised angle between each of the third surface and the fourth surface of the first light modulation portion and the first surface of the first light modulation portion is greater than or equal to 60 degrees, and smaller than or equal to 80 degrees.

In some embodiments, the at least one sub-pixel comprises a first sub-pixel, wherein a length of the first sub-pixel along a first direction is greater than a length of the first sub-pixel along a second direction perpendicular to the first direction, and an orthographic projection of the second light modulation portion corresponding to each of the at least one sub-pixel on the base substrate is a third orthographic projection; an edge of each of the first orthographic projection, the second orthographic projection and the third orthographic projection corresponding to each of the at least one sub-pixel comprises a first edge and a second edge arranged oppositely along the first direction, and a third edge and a fourth edge arranged oppositely along the second direction, wherein each of the third edge and the fourth edge is adjacent to the first edge and the second edge, and at least one of the first edge or the second edge of the first orthographic projection corresponding to the first sub-pixel has a recess.

In some embodiments, the at least one sub-pixel further comprises a green sub-pixel, and at least one of the third edge or the fourth edge of the first orthogonal projection corresponding to the green sub-pixel has a recess.

In some embodiments, at least one of the third edge or the fourth edge of the second orthogonal projection corresponding to the green sub-pixel has a recess.

In some embodiments, at least one of the third edge or the fourth edge of the third orthogonal projection corresponding to the green sub-pixel has a recess.

In some embodiments, the display panel satisfies the first condition and the second condition.

In some embodiments, the encapsulation layer comprises: a first inorganic layer, wherein a surface of the first inorganic layer away from the base substrate has a plurality of recess portions in one-to-one correspondence to the plurality of first openings; a second inorganic layer located on one side of the first inorganic layer away from the base substrate; an organic layer located between the first inorganic layer and the second inorganic layer; and at least one first optical structure located between the first inorganic layer and the organic layer, wherein a refractive index of each of the at least one first optical structure is greater than a refractive index of the organic layer.

According to another aspect of the embodiments of the present disclosure, provided is a display panel. The display panel comprises: a base substrate; a pixel defining layer located on one side of the base substrate and having a plurality of first openings for defining a plurality of sub-pixels, wherein the plurality of first openings is in one-to-one correspondence to the plurality of sub-pixels; an encapsulation layer located on one side of the pixel defining layer away from the base substrate; and a light modulation layer located on one side of the encapsulation layer away from the base substrate, and comprising: a first light modulation sub-layer having at least one second opening in one-to-one correspondence to at least one sub-pixel of the plurality of sub-pixels, wherein orthographic projections of a first opening and a second opening which correspond to each of the at least one sub-pixel on the base substrate are a first orthographic projection and a second orthographic projection respectively, and a second light modulation sub-layer comprising a first light modulation portion located in each of the at least one second opening, wherein the light modulation layer is configured such that light from each of the at least one sub-pixel propagates along a direction away from the base substrate after total reflection upon incidence on an interface between the first light modulation portion in the second opening corresponding to each of the at least one sub-pixel and the first light modulation sub-layer; wherein the display panel satisfies at least one of a first condition or a second condition, wherein: the first condition is that at least a part of an edge of the first orthogonal projection has a recess, and the second condition is that at least a part of the interface is non-planar.

According to still another aspect of the embodiments of the present disclosure, provided is a display device, comprising the display panel according to any one of the above embodiments.

According to yet still another aspect of the embodiments of the present disclosure, provided is a manufacturing method of a display panel, comprising: providing a base substrate; forming a pixel defining layer on one side of the base substrate, wherein the pixel defining layer has a plurality of first openings for defining a plurality of sub-pixels, and the plurality of first openings is in one-to-one correspondence to the plurality of sub-pixels; forming an encapsulation layer on one side of the pixel defining layer away from the base substrate; and forming a light modulation layer on one side of the encapsulation layer away from the base substrate. Forming the light modulation layer comprises: forming a first light modulation sub-layer, wherein the first light modulation sub-layer has at least one second opening in one-to-one correspondence to at least one sub-pixel of the plurality of sub-pixels, and orthographic projections of a first opening and a second opening which correspond to each of the at least one sub-pixel on the base substrate are a first orthographic projection and a second orthographic projection respectively; and forming a second light modulation sub-layer comprising a first light modulation portion located in each of the at least one second opening, wherein the light modulation layer is configured such that light from each of the at least one sub-pixel propagates along a side away from the base substrate after total reflection upon incidence on an interface between the first light modulation portion in the second opening corresponding to each of the at least one sub-pixel and the first light modulation sub-layer. The display panel satisfies at least one of a first condition or a second condition, wherein: the first condition is that at least a part of an edge of the first orthogonal projection has a recess, and the second condition is that at least a part of an edge of the second orthogonal projection has at least one of a recess or a protrusion.

BRIEF DESCRIPTION OF THE DRAWINGS

The accompanying drawings which constitute a part of this specification, illustrate the embodiments of the present disclosure, and together with this specification, serve to explain the principles of the present disclosure.

The present disclosure may be more explicitly understood from the following detailed description with reference to the accompanying drawings, in which.

It should be appreciated that, the same or similar reference numerals refer to the same or similar components.

DESCRIPTION OF THE INVENTION

Figure 1A:
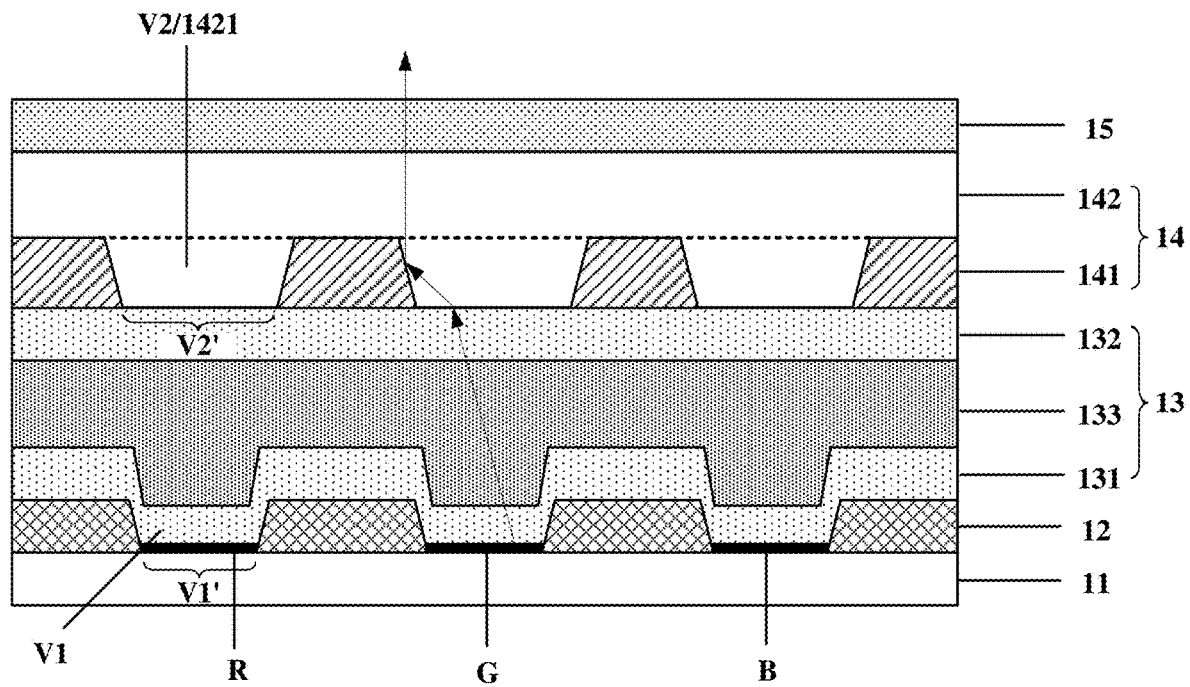
FIG. 1A is a schematic structure view showing a display panel according to some embodiments of the present disclosure.

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity, or importance, but are merely used to distinguish between different parts. A word such as "comprise", "have" or variants thereof means that the element before the word covers the element (s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In a related art, the front light-emitting efficiency of a display panel, that is, the light-emitting efficiency perpendicular to a base substrate in the display panel, can be improved by providing an additional optical structure. For example, the optical structure comprises a layer with a high refractive index and a layer with a low refractive index, some light might be totally reflected upon incidence from the layer with a high refractive index to the layer with a low refractive index, so that the light that would not emit towards the front will emit towards the front or towards nearly the front, thereby improving the front light-emitting efficiency of the display panel.

The embodiments of the present disclosure provide a display panel which can further improve the front light-emitting efficiency.

FIG. 1A is a schematic structure view showing a display panel according to some embodiments of the present disclosure.

As shown in FIG. 1A, the display panel comprises a base substrate 11, a pixel defining layer 12, an encapsulation layer 13 and a light modulation layer 14 (which may also be referred to as a first light modulation layer 14 in certain embodiments). In some embodiments, referring to FIG. 1A, the display panel further comprises a module layer 15. For example, the module layer 15 comprises a touch layer, a polarizer layer and a cover plate sequentially located on one side of the light modulation layer 14 away from the base substrate 11.

For example, the base substrate 11 may be a glass substrate. For another example, the base substrate 11 may be a flexible substrate such as a polyimide (PI) substrate.

The pixel defining layer 12 is located on one side of the base substrate 11 and has a plurality of first openings V1 for defining a plurality of sub-pixels. Here, the plurality of first openings V1 is in one-to-one correspondence to the plurality of sub-pixels. For example, the plurality of sub-pixels comprises a red sub-pixel R, a green sub-pixel G and a blue sub-pixel B.

It should be understood that, the display panel may also comprise other components not shown in FIG. 1A, for example, a plurality of pixel driving circuits and a planarization layer covering the plurality of pixel driving circuits. The anode of each sub-pixel may be located on one side of the planarization layer away from the base substrate 11 and connected to a pixel driving circuit. The pixel defining layer 12 may be located on one side of the planarization layer and the anode away from the base substrate 11. Each first opening V1 of the pixel defining layer 12 exposes at least a part of an anode of a corresponding sub-pixel.

The encapsulation layer 13 is located on one side of the pixel defining layer 12 away from the base substrate 11. As some implementations, the encapsulation layer 13 comprises a first inorganic layer 131, a second inorganic layer 132, and an organic layer 133 located between the first inorganic layer 131 and the second inorganic layer 132.

The light modulation layer 14 is located on one side of the encapsulation layer 13 away from the base substrate 11. The light modulation layer 14 comprises a first light modulation sub-layer 141 and a second light modulation sub-layer 142, and the refractive index of the second light modulation sub-layer 142 is greater than that of the first light modulation sub-layer 141.

The first light modulation sub-layer 141 has at least one second opening V2 in one-to-one correspondence to at least one sub-pixel. The second light modulation sub-layer 142 comprises a first light modulation portion 1421 located in each second opening V2. For example, the first light modulation sub-layer 141 has only one second opening V2 corresponding to one sub-pixel. For another example, the first light modulation sub-layer 141 has a plurality of second openings V2 in one-to-one correspondence to a plurality of sub-pixels.

The light modulation layer 14 is configured such that light from each of at least one sub-pixel propagates along a direction away from the base substrate 11 after total reflection upon incidence on an interface between the first light modulation portion 1421 in a corresponding second opening V2 and the first light modulation sub-layer 141. For example, FIG. 1A shows that light from the green sub-pixel G propagates along a direction perpendicular to the base substrate 11 after total reflection upon incidence on an interface between the first light modulation portion 1421 in a corresponding second opening V2 and the first light modulation sub-layer 141.

It can be understood that, at least one sub-pixel corresponds to a first opening V1 and a second opening V2. Hereinafter, the orthographic projections of the first opening V1 and the second opening V2 corresponding to each sub-pixel like this on the base substrate 11 will be referred to as a first orthographic projection V1' and a second orthographic projection V2' respectively.

The display panel of FIG. 1A satisfies at least one of a first condition or a second condition below. Here, the first condition is that: at least a part of the edge of the first orthographic projection V1' has a recess RS; and the second condition is that: at least a part of the edge of the second orthographic projection V2' has at least one of a recess RS or a protrusion PT.

Figure 1B:
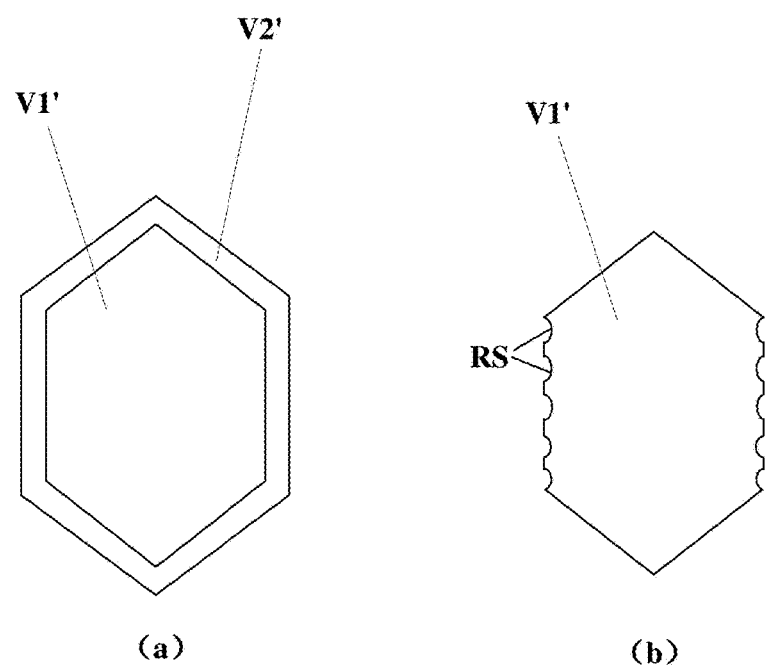
FIGS. 1B and 1C are schematic views showing a first orthographic projection and a second orthographic projection according to some embodiments of the fundamental disclosure.
Figure 1C:
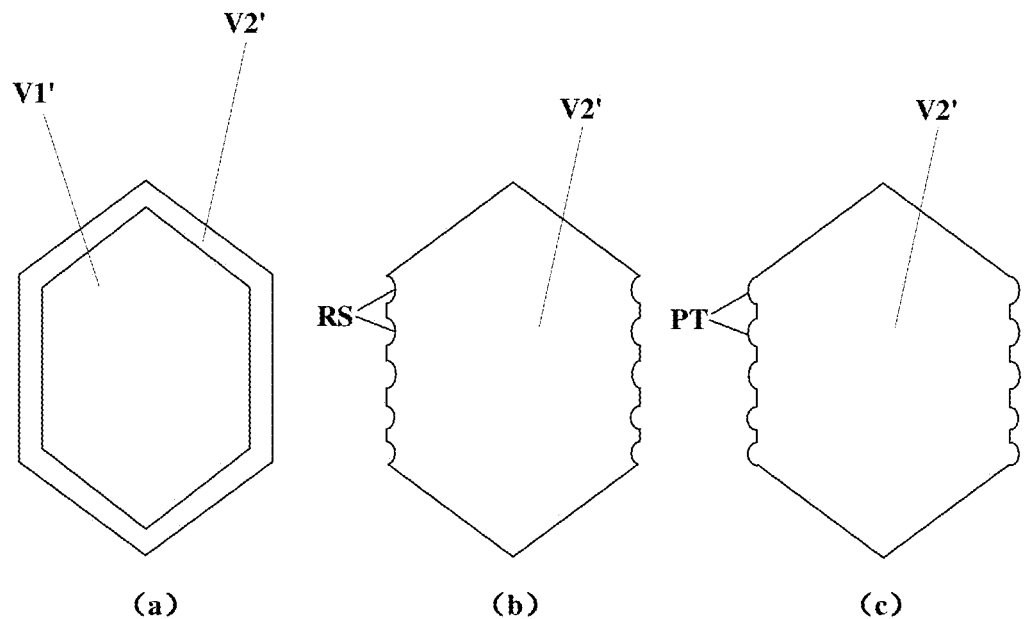

FIGS. 1B and 1C are schematic views showing a first orthographic projection and a second orthographic projection according to some embodiments of the fundamental disclosure. The first condition and the second condition according to some embodiments of the present disclosure will be described below in conjunction with FIGS. 1B and 1C.

To show the recess RS and the protrusion PT more clearly, both figure (a) in FIG. 1B and figure (a) in FIG. 1C show the case where both the first orthographic projection V1' and the second orthographic projection V2' have no recess RS or protrusion PT. Here, the first orthographic projection V1' and the second orthographic projection V2' are schematically shown as hexagons. It should be understood that, the embodiments of the present disclosure are not limited thereto, and the first orthogonal projection V1' and the second orthogonal projection V2' may also have other shapes.

First, the first condition will be introduced.

Referring to figure (b) in FIG. 1B, the first condition is that: at least a part of the edge of the first orthographic projection V1' has a recess RS. For example, the first orthographic projection V1' is hexagonal, and at least one side of the first orthographic projection V1' has a recess RS, and the other sides of the first orthographic projection V1' have no recess RS. For another example, the first orthographic projection V1' is hexagonal, and each side of the first orthographic projection V1' has a recess RS.

It can be understood that, in a case where the display panel satisfies the first condition, it is conductive to reduce the size of the first opening V1 of the pixel defining layer 12. In this way, it helps to improve the front light-emitting efficiency of the display panel.

Next, the second condition will be introduced.

Referring to figure (b) in FIG. 1C, the second condition comprises that: at least a part of the edge of the second orthographic projection V2' has a recess RS. For example, the second orthographic projection V2' is hexagonal, and at least one side of the second orthographic projection V2' has a recess RS, and the other sides of the second orthographic projection V2' have no recess RS. For another example, the second orthographic projection V2' is hexagonal, and each side of the second orthographic projection V2' has a recess RS.

Referring to figure (c) in FIG. 1C, the second condition comprises that: at least a part of the edge of the second orthographic projection V2' has a protrusion PT. For example, the second orthographic projection V2' is hexagonal, and at least one side of the second orthographic projection V2' has a protrusion PT, and the other sides of the second orthographic projection V2' have no protrusion Pt. For another example, the second orthographic projection V2' is hexagonal, and each side of the second orthographic projection V2' has a protrusion PT.

It should be understood that, the display panel also satisfies the second condition in a case where at least a part of the edge of the second orthographic projection V2' has a recess RS and a protrusion PT at the same time.

Figure 1D:
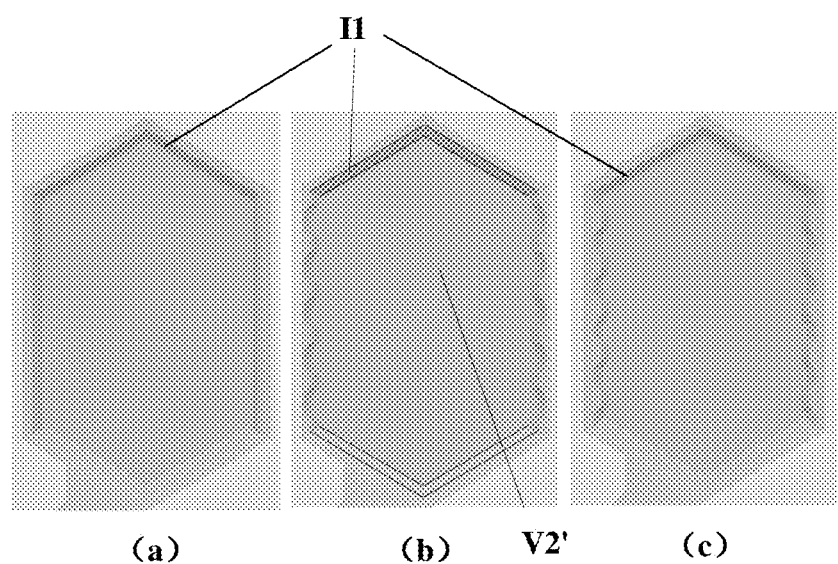
FIG. 1D is a schematic view showing a second orthographic projection according to other embodiments of the fundamental disclosure.

FIG. 1D is a schematic view showing a second orthographic projection according to other embodiments of the fundamental disclosure. The second condition according to other embodiments of the present disclosure will be described below in conjunction with FIG. 1D.

FIG. 1D shows an interface I1 between the first light modulation portion 1421 and the first light modulation sub-layer 141.

Referring to figure (a) in FIG. 1D, the interface I1 between the first light modulation portion 1421 and the first light modulation sub-layer 141 is planar.

Referring to figure (b) and figure (c) in FIG. 1D, the second condition is that: at least a part of the interface I1 between the first light modulation portion 1421 and the first light modulation sub-layer 141 is non-planar. For example, the interface I1 is composed of a plurality of faces. In some cases, at least one face of the interface I1 is non-planar and the other faces of the interface I1 are planar. In other cases, each face of the interface I1 is non-planar.

It can be understood that, at least a part of the interface I1 is non-planar in the case where at least a part of the edge of the second orthographic projection V2' has at least one of a recess RS or a protrusion PT.

As can be seen from FIG. 1D, the area of the interface I1 in the case where at least a part of the interface I1 is non-planar is greater than that of a plane. In this way, more light from a sub-pixel can be totally reflected, which helps to improve the front light-emitting efficiency of the display panel.

In the above embodiments, the display panel satisfies at least one of the first condition or the second condition. This structure helps to improve the front light-emitting efficiency of the display panel.

In some embodiments, the display panel satisfies the first condition and the second condition. Such a structure helps to further improve the front light-emitting efficiency of the display panel.

In some embodiments, the front light-emitting efficiency in the case where the display panel satisfies at least one of the first condition or the second condition is 5% higher than that in the case where the display panel does not satisfy the first condition and the second condition.

Figure 2:
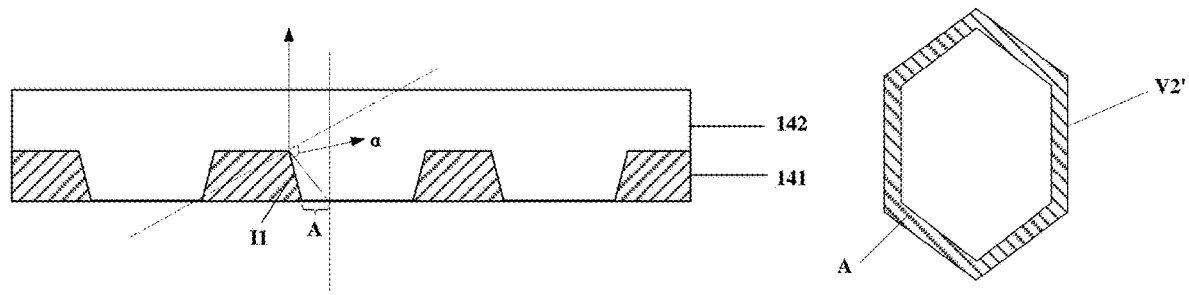
FIG. 2 is a partial schematic view of the display panel shown in FIG. 1A.

FIG. 2 is a partial schematic view of the display panel shown in FIG. 1A.

As shown in FIG. 2, it is assumed that light from a sub-pixel will be totally reflected after incidence on the interface I1 via the region A. α is equal to the total reflection angle arcsin (n1/n2), where n1 is the refractive index of the first light modulation sub-layer 141, and n2 is the refractive index of the second light modulation sub-layer 142.

The front light-emitting efficiency of the display panel can be equivalent to the ratio of the area of the region A to the area of the first orthogonal projection V1' of the first opening V1 of the pixel defining layer 12. It can be seen that, the front light-emitting efficiency of the display panel can be improved by increasing the area of the region A or decreasing the area of the first orthographic projection V1'.

In the case where the area of the interface I1 is increased, it means that the area of the region A is increased, thereby improving the front light-emitting efficiency of the display panel.

Therefore, the light-emitting efficiency of the display panel can be improved in the case where the display panel satisfies at least one of the first condition or the second condition.

In some embodiments, at least a part of the edge of the first orthogonal projection V1' of the first opening V1 corresponding to a blue sub-pixel B on the base substrate 11 has a recess RS, as shown in figure (b) of FIG. 1B. In this way, it helps to improve the front efficiency of white light of the display panel.

In other embodiments, at least a part of the edge of the second orthogonal projection V2' of the second opening V2 corresponding to a blue sub-pixel B on the base substrate 11 has at least one of a recess RS or a protrusion PT, as shown in figure (b) and figure (c) of FIG. 1C. In this way, it helps to improve the front efficiency of white light of the display panel.

Figure 3A:
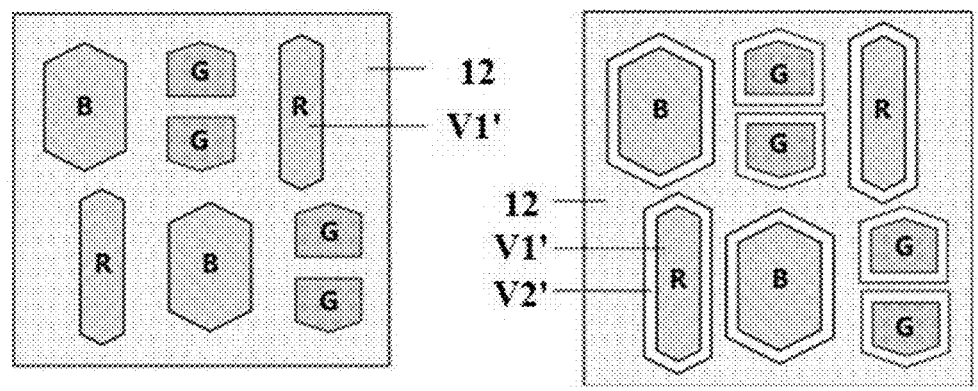
FIGS. 3A and 3B are schematic views showing the arrangement of sub-pixels in a display panel according to some embodiments of the present disclosure.
Figure 3B:
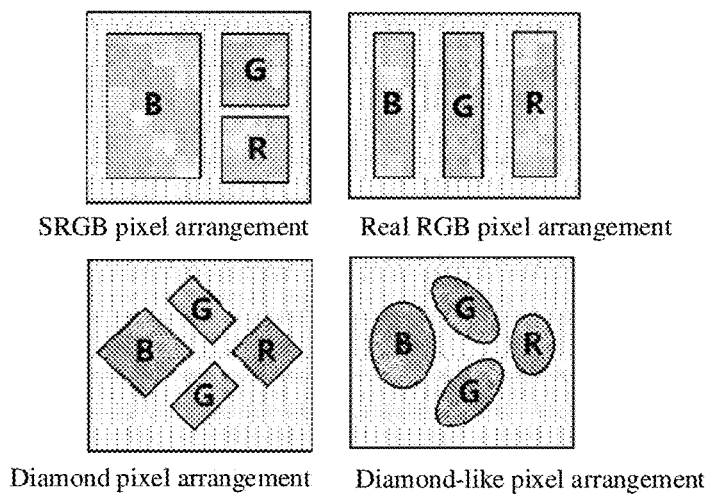

FIGS. 3A and 3B are schematic views showing the arrangement of sub-pixels in a display panel according to some embodiments of the present disclosure.

In some embodiments, as shown in FIG. 3A, a plurality of sub-pixels in the display panel may be in a GGRB pixel arrangement, that is, one pixel is composed of two green sub-pixels G, one red sub-pixel R and one blue sub-pixel B. For example, the shape of the first orthographic projection V1' of the first opening V1 corresponding to the green sub-pixel G is pentagon, and the shape of the first orthographic projection V1' of the first opening V1 corresponding to each of the red sub-pixel R and the blue sub-pixel B is hexagon.

In other embodiments, as shown in FIG. 3B, a plurality of sub-pixels in the display panel may be in a standard RGB pixel arrangement pixel arrangement), a traditional RGB pixel arrangement (Real RGB pixel arrangement), a diamond pixel arrangement or a diamond-like pixel arrangement.

FIGS. 4A-4D are schematic views showing a first orthographic projection and a second orthographic projection according to further embodiments of the present disclosure. In FIGS. 4A-4D, the first direction and the second direction are perpendicular to each other.

As shown in FIGS. 4A-4D, the edges of the first orthographic projection V1' and the second orthographic projection V2' each comprise a first edge E1 and a second edge E2 arranged oppositely along the first direction, and a third edge E3 and a fourth edge E4 arranged oppositely along the second direction, and each of the third edge E3 and the fourth edge E4 is adjacent to the first edge E1 and the second edge E2.

Figure 4A:
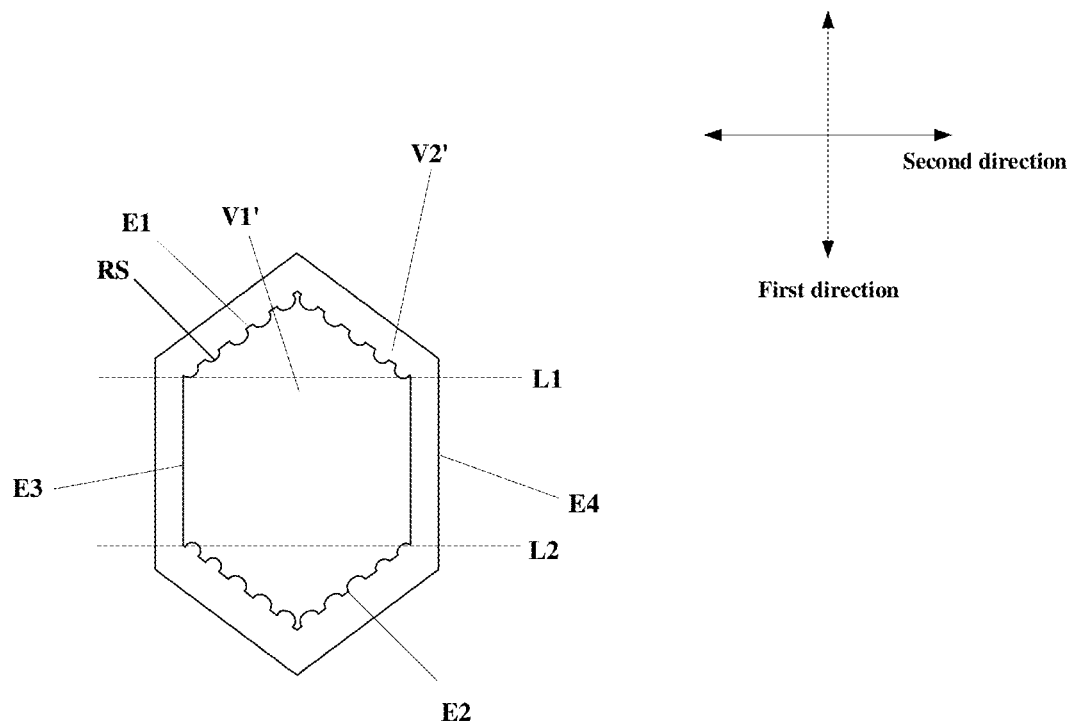
FIGS. 4A-4D are schematic views showing a first orthographic projection and a second orthographic projection according to further embodiments of the present disclosure.
Figure 4B:
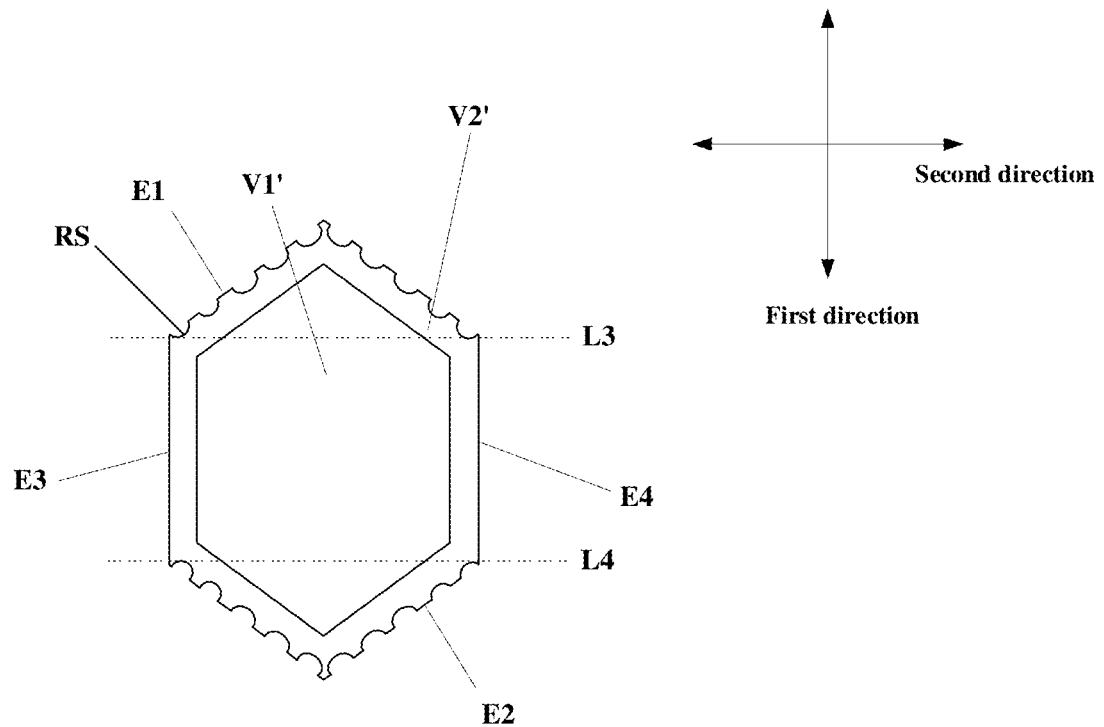
Figure 4C:
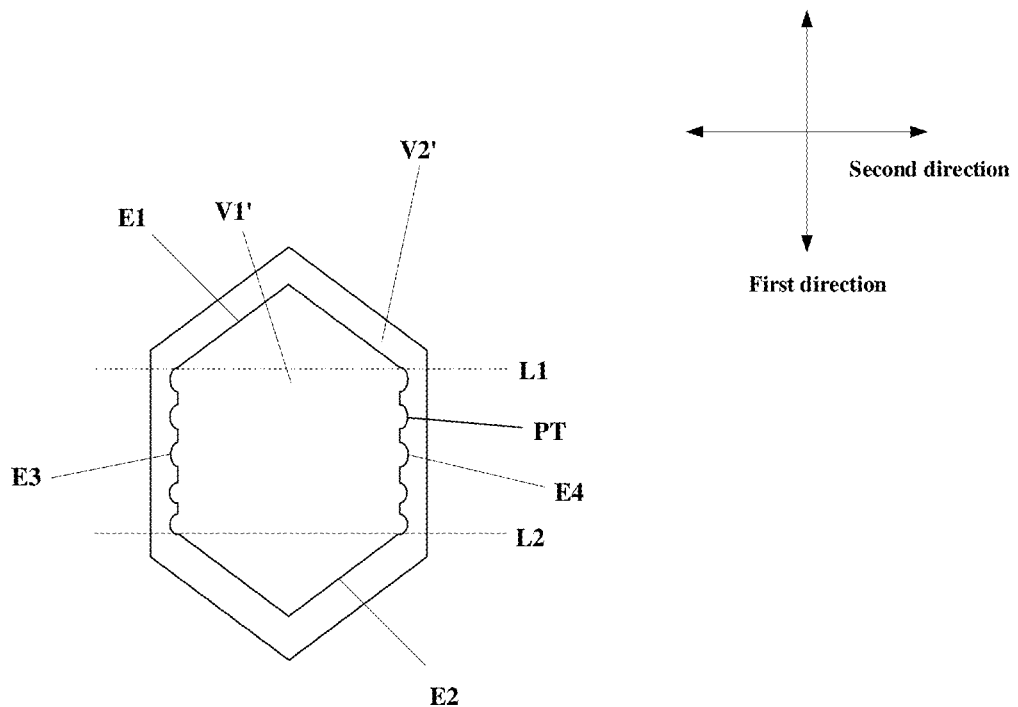
Figure 4D:
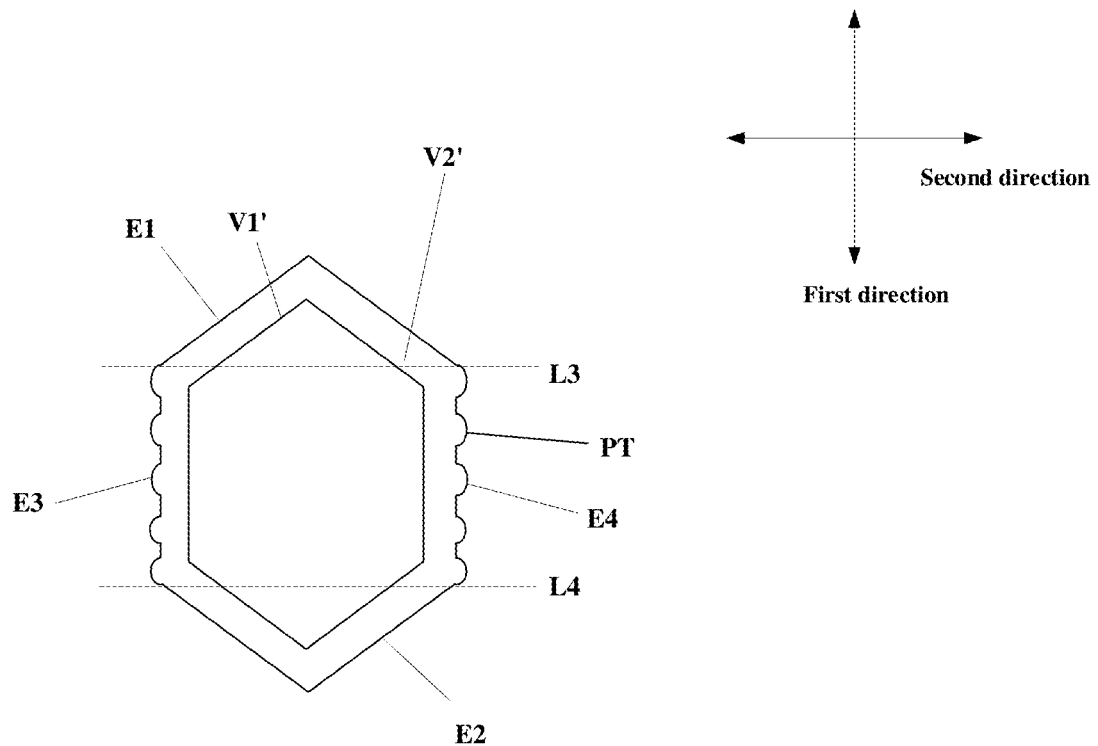

In FIGS. 4A and 4C, a part of the edge of the first orthographic projection V1' above the line L1 is the first edge E1, and a part of the edge of the first orthographic projection V1' below the line L2 is the second edge E2. In FIGS. 4B and 4D, a part of the edge of the second orthographic projection V2' above the line L3 is the first edge E1, and a part of the edge of the second orthographic projection V2' below the line L4 is the second edge E2.

In some embodiments, referring to FIG. 4A, a certain sub-pixel or some sub-pixels (hereinafter referred to as a first sub-pixel) in the display panel have a length along the first direction greater than a length along the second direction.

The inventors have noticed that, the display panel shown in FIG. 1A is present with a white-light color deviation. The inventors have found by analysis that, the main reason of the white-light color deviation is the attenuation difference in different directions of the light emitted by the sub-pixel with different lengths in different directions. To take into account both the front light-emitting efficiency and the white-light color deviation of the display panel, the embodiments of the present disclosure also provide the following solutions.

As some implementations, referring to FIG. 4A, at least one of the first edge E1 or the second edge E2 of the first orthographic projection V1' of a first sub-pixel (for example, a red sub-pixel R) in the display panel shown in FIG. 1A has a recess RS, and the third edge E3 and the fourth edge E4 of the first orthographic projection V1' of the first sub-pixel have no recess. Here, FIG. 4A shows the case where both the first edge E1 and the second edge E2 of the first orthographic projection V1' have a recess RS. In some embodiments, referring to FIG. 4A, the third edge E3 and the fourth edge E4 of the first orthographic projection V1' of the first sub-pixel are straight edges.

In such implementations, the attenuation difference of the light of the first sub-pixel along the first direction and the second direction can be reduced, thus the white-light color deviation of the display panel can be reduced on the basis of improving the front light-emitting efficiency of the display panel.

As other implementations, referring to FIGS. 4A and 4B, at least one of the first edge E1 or the second edge E2 of the first orthographic projection V1' corresponding to the first sub-pixel in the display panel shown in FIG. 1A has a recess RS, the third edge E3 and the fourth edge E4 of the first orthographic projection V1' of the first sub-pixel have no recess, and at least one of the first edge E1 or the second edge E2 of the second orthographic projection V2' corresponding to the first sub-pixel in the display panel shown in FIG. 1A has a recess RS. FIG. 4B shows the case where both the first edge E1 and the second edge E2 of the second orthographic projection V2' have a recess RS.

In such implementations, the attenuation difference of the light of the first sub-pixel along the first direction and the second direction can be further reduced, thus the white-light color deviation of the display panel can be further reduced on the basis of improving the front light-emitting efficiency of the display panel.

As further implementations, referring to FIGS. 4A and 4C, at least one of the first edge E1 or the second edge E2 of the first orthographic projection V1' of the first sub-pixel in the display panel shown in FIG. 1A has a recess RS, and at least one of the third edge E3 or the fourth edge E4 of the first orthographic projection V1' corresponding to the first sub-pixel in the display panel shown in FIG. 1A has a protrusion PT. FIG. 4C shows the case where both the third edge E3 and the fourth edge E4 of the first orthographic projection V1' have a protrusion PT.

In such implementations, the attenuation difference of the light of the first sub-pixel along the first direction and the second direction can be further reduced, thus the white-light color deviation of the display panel can be further reduced on the basis of improving the front light-emitting efficiency of the display panel.

As further implementations, referring to FIGS. 4A and 4D, at least one of the first edge E1 or the second edge E2 of the first orthographic projection V1' of the first sub-pixel in the display panel shown in FIG. 1A has a recess RS, the third edge E3 and the fourth edge E4 of the first orthographic projection V1' corresponding to the first sub-pixel in the display panel shown in FIG. 1A have no recess, and at least one of the third edge E3 or the fourth edge E4 of the second orthographic projection V2' corresponding to the first sub-pixel in the display panel shown in FIG. 1A has a protrusion PT. FIG. 4D shows the case where both the third edge E3 and the fourth edge E4 of the second orthographic projection V2' have a protrusion PT.

In such implementations, the attenuation difference of the light of the first sub-pixel along the first direction and the second direction can be still further reduced, thus the white-light color deviation of the display panel can be still further reduced on the basis of improving the front light-emitting efficiency of the display panel.

As further implementations, referring to FIG. 4A, at least one of the first edge E1 or the second edge E2 of the first orthographic projection V1' of the first sub-pixel in the display panel shown in FIG. 1A has a recess RS, the third edge E3 and the fourth edge E4 of the first orthographic projection V1' of the first sub-pixel have no recess, and the edge of the second orthographic projection V2' of the first sub-pixel has no recess or protrusion.

As further implementations, referring to FIG. 4B, the edge of the first orthographic projection V1' of the first sub-pixel has no recess or protrusion, and at least one of the first edge E1 or the second edge E2 of the second orthographic projection V2' of the first sub-pixel has a recess RS.

As further implementations, referring to FIG. 4D, the edge of the first orthographic projection V1' of the first sub-pixel has no recess or protrusion, and at least one of the third edge E3 or the fourth edge E4 of the second orthographic projection V2' of the first sub-pixel has a protrusion PT.

It should be understood that, in the plurality of implementations above, the white-light color deviation of the display panel can be reduced on the basis of improving the front light-emitting efficiency of the display panel.

In some embodiments, a plurality of sub-pixels of the display panel comprises a first sub-pixel, a second sub-pixel and a third sub-pixel configured to emit light of different colors, and the ratio of the length of the first sub-pixel along the first direction to the length of the first sub-pixel along the second direction is greater than the ratio of the length of the second sub-pixel along the first direction to the length of the second sub-pixel along the second direction, and greater than the ratio of the length of the third sub-pixel along the first direction to the length of the third sub-pixel along the second direction. For example, the first sub-pixel is a red sub-pixel R, the second sub-pixel is a blue sub-pixel B, and the third sub-pixel is a green sub-pixel G.

It should be noted that, in the present disclosure, the recess RS and the protrusion PT herein are relative concepts, which will be described below in conjunction with FIGS. 4A and 4D.

As shown in FIG. 4A, in the case where the first edge E1 and the second edge E2 of the first orthographic projection V1' have a recess RS, and the third edge E3 and the fourth edge E4 of the first orthographic projection V1' are straight edges, the distance between a recess RS and the edge of the second orthographic projection V2' is greater than or equal to the distance between each of the third edge E3 and the fourth edge E4 of the first orthographic projection V1' and the edge of the second orthographic projection V2'.

As shown in FIG. 4D, in the case where the first edge E1 and the second edge E2 of the second orthographic projection V2' are straight edges and the third edge E3 and the fourth edge E4 have a protrusion PT, the distance between a protrusion PT and the edge of the first orthographic projection V1' is greater than or equal to the distance between each of the first edge E1 and the second edge E2 of the second orthographic projection V2' and the edge of the second orthographic projection V2'.

Figure 5A:
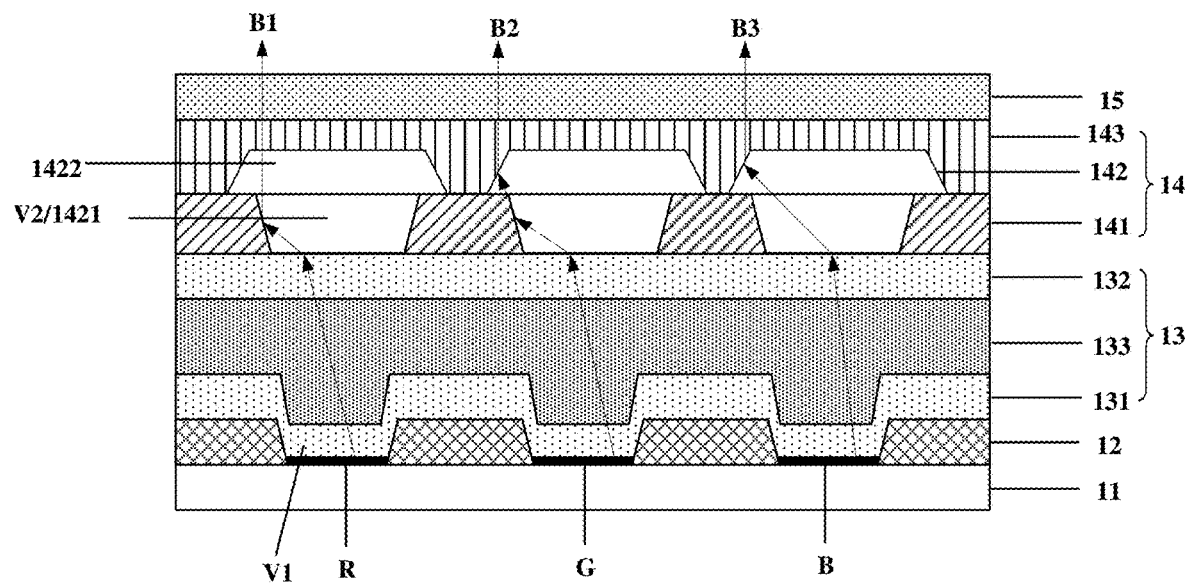
FIGS. 5A and 5B are schematic structure views showing a display panel according to other embodiments of the present disclosure.
Figure 5B:
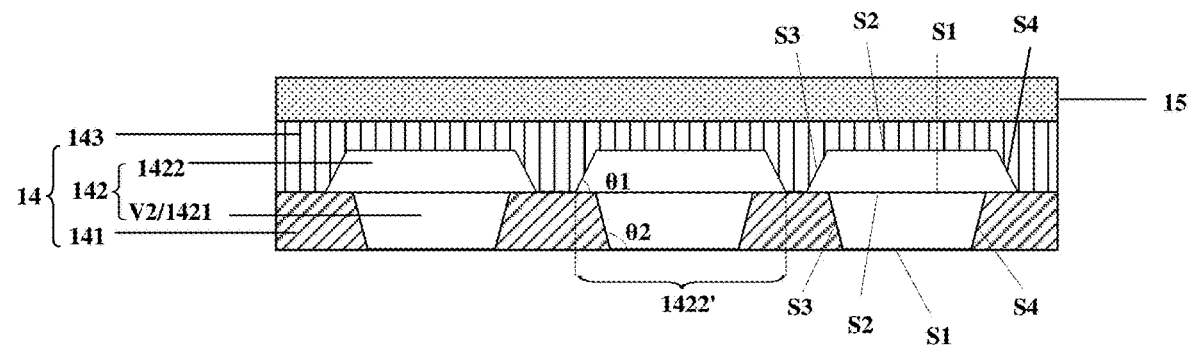

FIGS. 5A and 5B are schematic structure views showing a display panel according to other embodiments of the present disclosure.

Only the differences between FIG. 5A and FIG. 1A will be mainly introduced below, and for other similarities, reference may be made to above description.

As shown in FIG. 5A, the second light modulation sub-layer 142 also comprises a second light modulation portion 1422 in addition to the first light modulation portion 1421 located in each second opening V2. The second light modulation portion 1422 is located on one side of the first light modulation portion 1421 and the first light modulation sub-layer 141 away from the base substrate 11, and adjacent to the first light modulation portion 1421. In some embodiments, the first light modulation portion 1421 is integrally provided with the second light modulation portion 1422.

In addition, the light modulation layer 14 also comprises a third light modulation sub-layer 143 located on one side of the first light modulation sub-layer 141 and the second light modulation sub-layer 142 away from the base substrate 11. Here, the refractive index of the third light modulation sub-layer 143 is smaller than that of the second light modulation portion 1422.

As shown in FIG. 5B, the first light modulation portion 1421 and the second light modulation portion 1422 each comprise a first surface S1 and a second surface S2 arranged oppositely, and a third surface S3 and a fourth surface S4 arranged oppositely. In each of the first light modulation portion 1421 and the second light modulation portion 1422, the second surface S2 is located on one side of the first surface S1 away from the base substrate 11, and each of the third surface S3 and the fourth surface S4 is adjacent to the first surface S1 and the second surface S2. It should be understood that, the second surface S2 of the first light modulation portion 1421 shown in FIG. 5B is contact with a part of the first surface S1 of the second light modulation portion 1422.

The first comprised angle θ1 between each of the third surface S3 and the fourth surface S4 of the second light modulation portion 1422 and the first surface S1 of the second light modulation portion 1422 is smaller than 90 degrees.

The light propagation condition of the display panel shown in FIG. 5A will be analyzed below in conjunction with the light B1, B2 and B3 shown in FIG. 5A.

The light B1 propagates along a direction perpendicular to the base substrate 11 after total reflection upon incidence on an interface between the first light modulation portion 1421 and the first light modulation sub-layer 141.

The light B2 is incident on the second light modulation portion 1422 and then on the third light modulation sub-layer 143 after total reflection upon incidence on an interface between the first light modulation portion 1421 and the first light modulation sub-layer 141. Since the refractive index of the third light modulation sub-layer 143 is smaller than that of the second light modulation portion 1422, the propagation direction of the light B2 in the third light modulation sub-layer 143 is closer to the direction perpendicular to the base substrate 11 than the propagation direction of the light B2 in the second light modulation portion 1422, thereby improving the front light-emitting effect of the display panel.

The light B3 directly enters the third light modulation sub-layer 143 via the first light modulation portion 1421 and the second light modulation portion 1422 sequentially rather than incidence on the interface between the first light modulation portion 1421 and the first light modulation sub-layer 141. Similar to the light B2, the propagation direction of the light B3 in the third light modulation sub-layer 143 is closer to the direction perpendicular to the base substrate 11 than the propagation direction of the light B3 in the second light modulation portion 1422, thereby improving the front light-emitting effect of the display panel.

In the above embodiments, the light modulation layer 14 further comprises the third light modulation sub-layer 143, and the second light modulation sub-layer 142 further comprises the second light modulation portion 1422. Such a display panel helps to further improve the front light-emitting effect of the display panel.

In some embodiments, referring to FIG. 5B, the first comprised angle θ1 is greater than or equal to 60 degrees, and smaller than 90 degrees. In the case where the first comprised angle θ1 is within this range, the front light-emitting effect of the display panel can be further improved.

In other embodiments, referring to FIG. 5B, the second comprised angle θ2 between each of the third surface S3 and the fourth surface S4 of the first light modulation portion 1421 and the first surface S1 of the first light modulation portion 1421 is greater than or equal to 60 degrees, and smaller than or equal to 80 degrees. In the case where the second comprised angle θ2 is within this range, the front light-emitting effect of the display panel can be further improved.

In further embodiments, the first comprised angle θ1 is greater than or equal to 60 degrees, and smaller than 90 degrees, and the second comprised angle θ2 is greater than or equal to 60 degrees, and smaller than or equal to 80 degrees. In this way, the front light-emitting effect of the display panel can be still further improved.

The inventors have noticed that, the display panel shown in FIG. 5A is also present with a white-light color deviation. The inventors have found by analysis that, the main reason of the white-light color deviation is the attenuation difference in different directions of the light emitted by sub-pixels with different lengths in different directions. To take into account the front light-emitting efficiency and the white-light color deviation of the display panel, the first sub-pixel in the display panel shown in FIG. 5A may also conform to the plurality of embodiments above described in conjunction with the above description, which will not be described in detail here.

Hereinafter, the orthographic projection of the second light modulation portion 1422 corresponding to a sub-pixel on the base substrate 11 is referred to as a third orthographic projection 1422'.

Figure 6A:
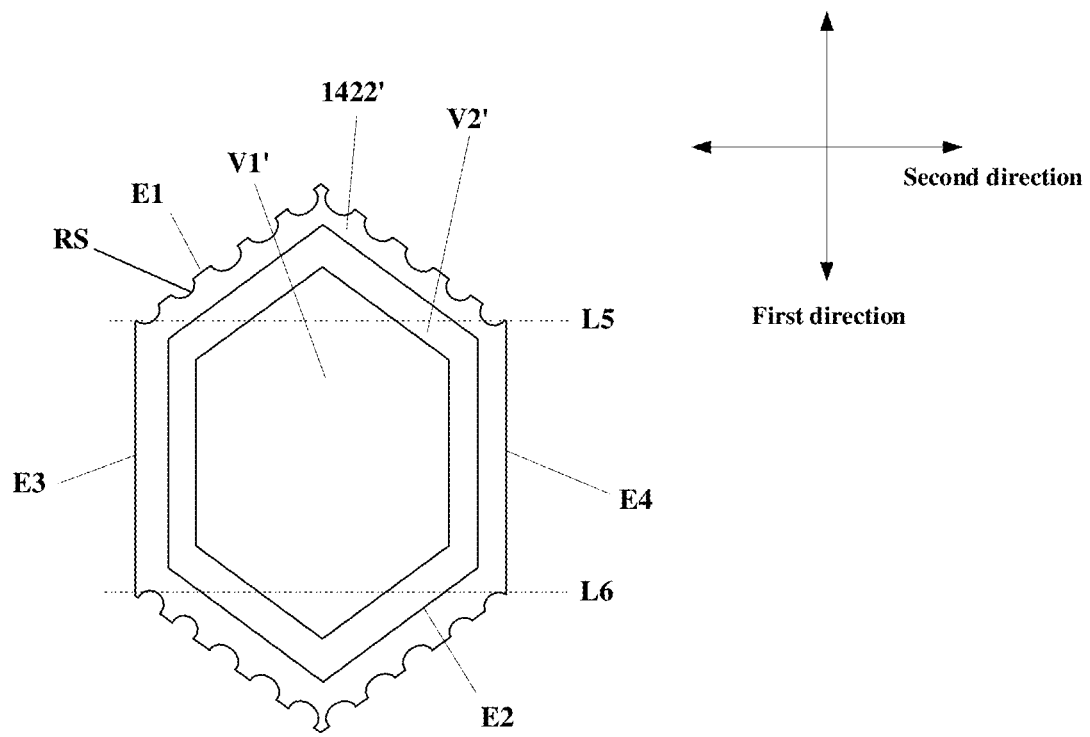
FIGS. 6A and 6B are schematic views showing a first orthogonal projection, a second orthogonal projection and a third orthogonal projection according to some embodiments of the present disclosure.
Figure 6B:
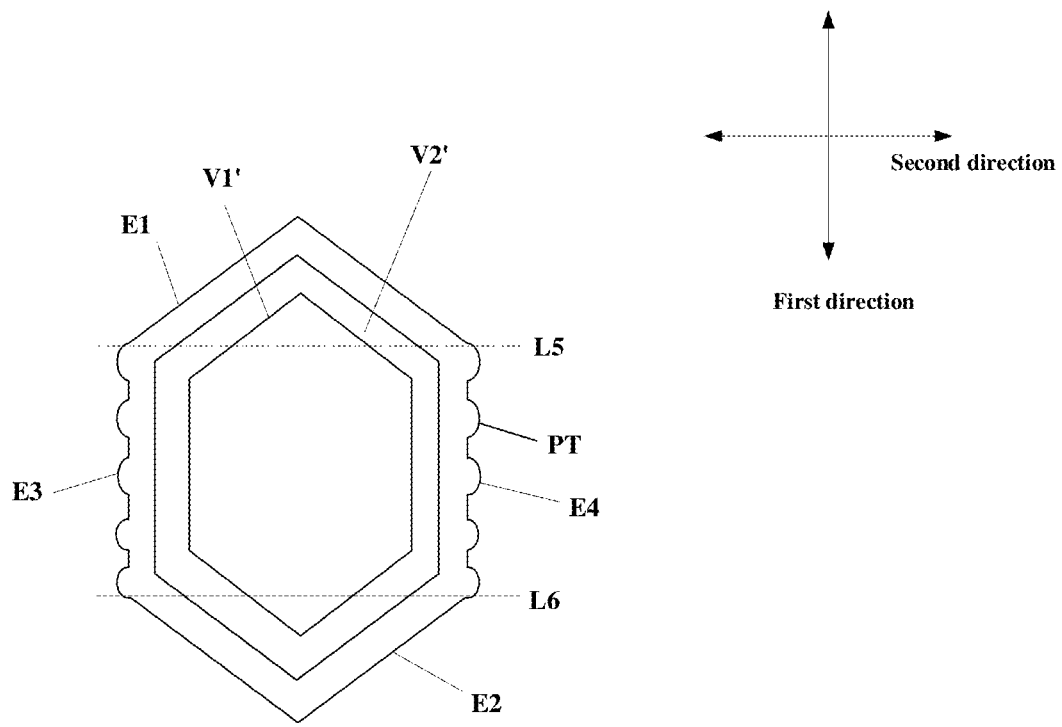

FIGS. 6A and 6B are schematic views showing a first orthogonal projection, a second orthogonal projection and a third orthogonal projection according to some embodiments of the present disclosure.

Similar to the first orthographic projection V1' and the second orthographic projection V2', referring to FIGS. 6A and 6B, the edge of the third orthographic projection 1422' also comprises a first edge E1 and a second edge E2 arranged oppositely along the first direction, and a third edge E3 and a fourth edge E4 arranged oppositely along the second direction. In the third orthogonal projection 1422', each of the third edge E3 and the fourth edge E4 is adjacent to the first edge E1 and the second edge E2.

In FIGS. 6A and 6B, a part of the edge of the third orthogonal projection 1422' above the line L5 is the first edge E1, a part of the edge of the third orthogonal projection 1422' below the line L6 is the second edge E2, and parts of the edge of the third orthogonal projection 1422' between the line L5 and the line L6 are the third edge E3 and the fourth edge E4.

In some implementations, referring to FIGS. 4A and 6A, at least one of the first edge E1 or the second edge E2 of the first orthographic projection V1 corresponding to the first sub-pixel in the display panel shown in FIG. 5A has a recess R, and at least one of the first edge E1 or the second edge E2 of the third orthographic projection 1422' corresponding to the first sub-pixel in the display panel shown in FIG. 5A has a recess R. FIG. 6A shows the case that both the first edge E1 and the second edge E2 of the third orthographic projection 1422' have a recess R.

In such implementations, it helps to further reduce the white-light color deviation of the display panel.

In other implementations, referring to FIGS. 4A and 6B, at least one of the first edge E1 or the second edge E2 of the first orthographic projection V1 corresponding to the first sub-pixel in the display panel shown in FIG. 5A has a recess R, and at least one of the third edge E3 or the fourth edge E4 of the third orthographic projection 1422' corresponding to the first sub-pixel in the display panel shown in FIG. 5A has a protrusion PT. FIG. 6B shows the case that both the third edge E3 and the fourth edge E4 of the third orthographic projection 1422' have a protrusion PT.

In such implementations, it helps to further reduce the white-light color deviation of the display panel.

The inventors have also noticed that, the display panel shown in FIG. 5A is also present with a yellow-green-light color deviation. The inventors have found by analysis that, the main reason of the yellow-green-light color deviation is slow attenuation of light emitted by the green sub-pixel G along the second direction. To reduce the yellow-green-light color deviation of the display panel, the embodiments of the present disclosure also provide the following solutions.

Figure 7A:
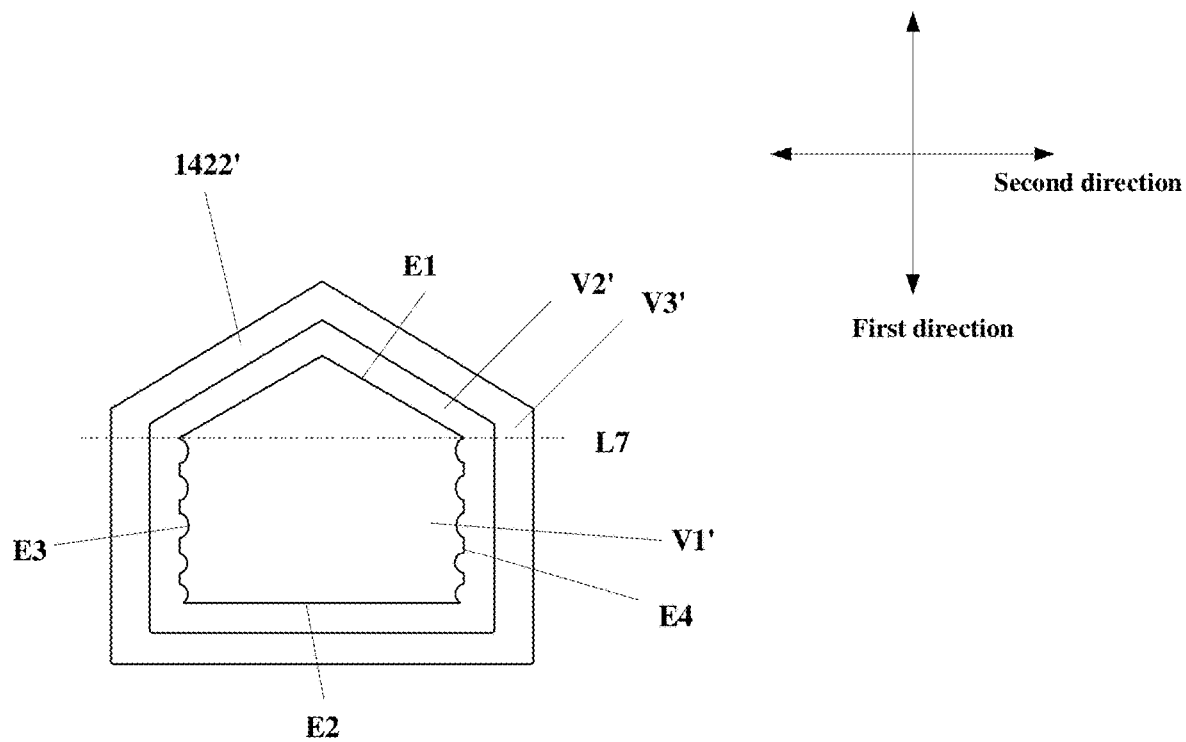
FIGS. 7A-7C are schematic views showing a first orthogonal projection, a second orthogonal projection and a third orthogonal projection according to other embodiments of the present disclosure.
Figure 7B:
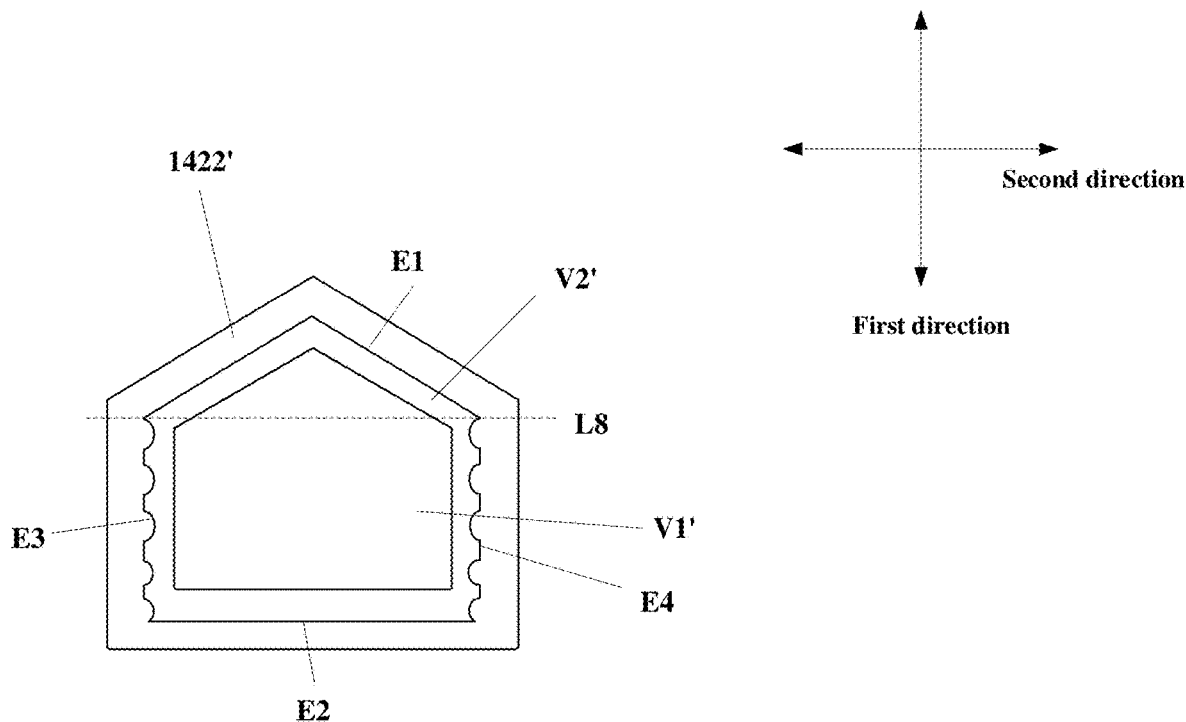
Figure 7C:
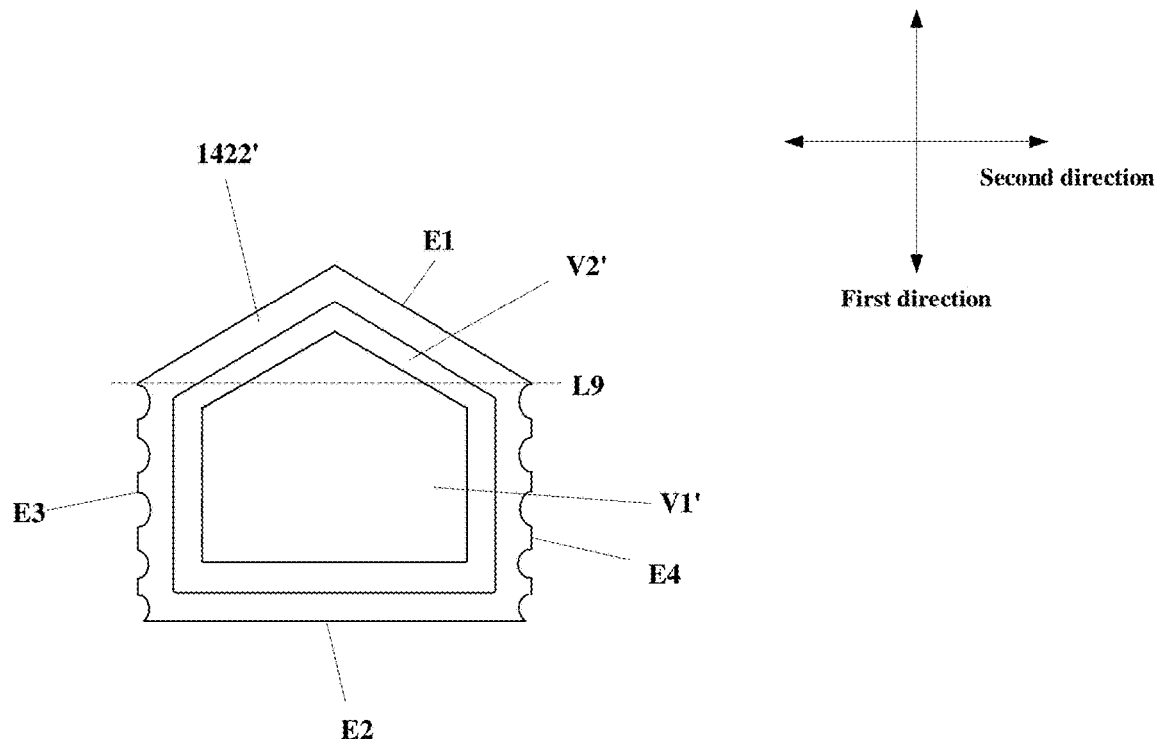

FIGS. 7A-7C are schematic views showing a first orthogonal projection, a second orthogonal projection and a third orthogonal projection according to other embodiments of the present disclosure.

In FIG. 7A, a part of the edge of the first orthogonal projection V1' corresponding to the green sub-pixel G above the line L7 is the first edge E1, a part of the edge of the first orthogonal projection V1' arranged opposite to the first edge E1 along the first direction and located below the line L7 is the second edge E2, and parts of the edge of the first orthogonal projection V1' arranged oppositely along the second direction and located below the line L7 are the third edge E3 and the fourth edge E4.

Similarly, in FIG. 7B, a part of the edge of the second orthographic projection V2' corresponding to the green sub-pixel G above the line L8 is the first edge E1, a part of the edge of the second orthogonal projection V2' arranged opposite to the first edge E1 along the first direction and located below the line L8 is the second edge E2, and parts of the edge of the second orthogonal projection V2' arranged oppositely along the second direction and located below the line L8 are the third edge E3 and the fourth edge E4.

Similarly, in FIG. 7C, a part of the edge of the third orthographic projection 1422' corresponding to the green sub-pixel G above the line L9 is the first edge E1, a part of the edge of the third orthographic projection 1422' arranged opposite to the first edge E1 along the first direction and located below the line L9 is the second edge E2, and parts of the edge of the third orthographic projection 1422' arranged oppositely along the second direction and located below the line L9 are the third edge E3 and the fourth edge E4.

In some implementations, referring to FIG. 7A, at least one of the third edge E3 or the fourth edge E4 of the first orthogonal projection V1' corresponding to the green sub-pixel G in the display panel shown in FIG. 5A has a recess RS. In this way, it helps to reduce the yellow-green-light color deviation of the display panel.

In other implementations, referring to FIG. 7B, at least one of the third edge E3 or the fourth edge E4 of the second orthogonal projection V2' corresponding to the green sub-pixel G has a recess RS. In this way, it helps to reduce the yellow-green-light color deviation of the display panel.

In further implementations, referring to FIG. 7C, at least one of the third edge E3 or the fourth edge E4 of the third orthogonal projection 1422' corresponding to the green sub-pixel G has a recess RS. In this way, it helps to reduce the yellow-green-light color deviation of the display panel.

It should be understood that, the implementations described above in FIGS. 7A-7C may be combined with each other to further reduce the yellow-green-light color deviation of the display panel.

Figure 8A:
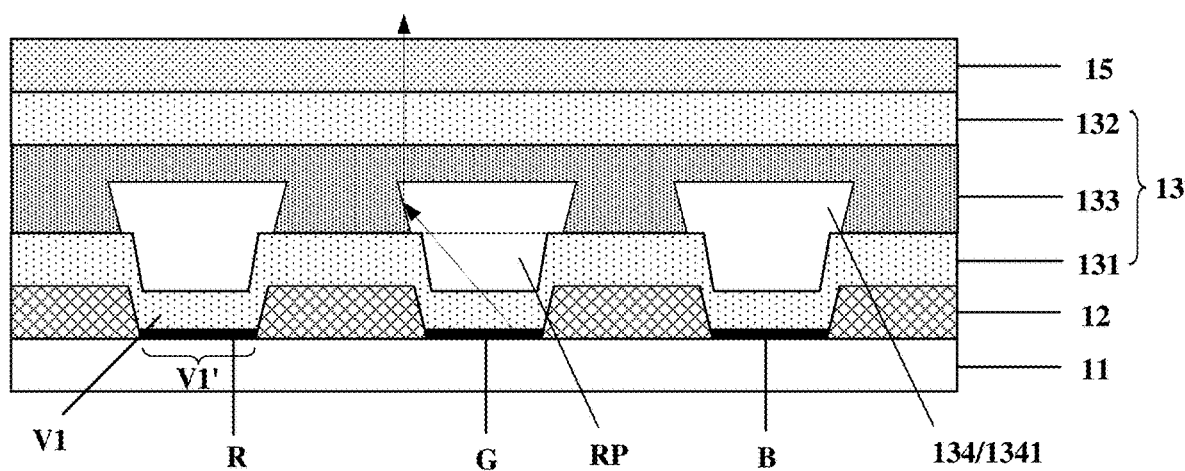
FIGS. 8A-8C are schematic structure views showing a display panel according to further embodiments of the present disclosure.
Figure 8B:
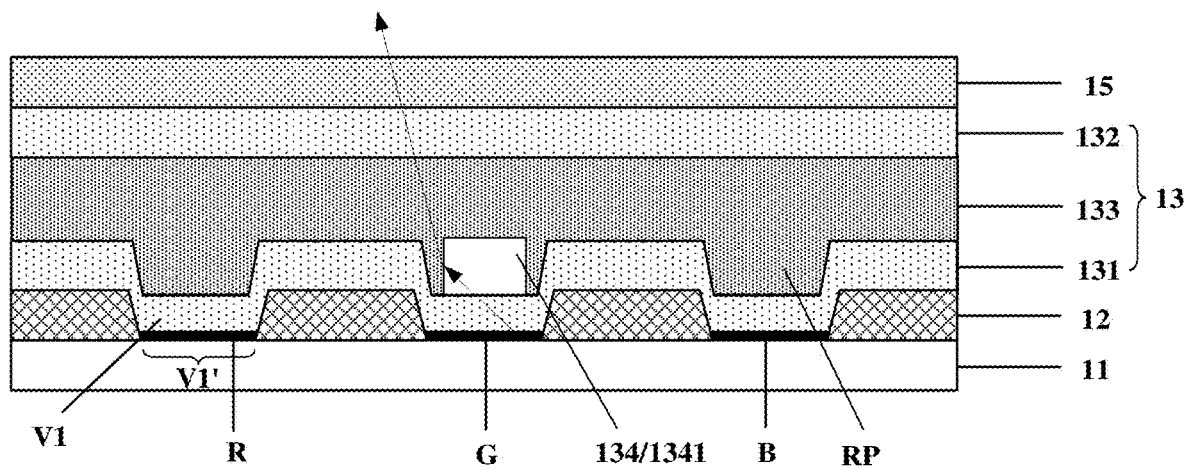
Figure 8C:
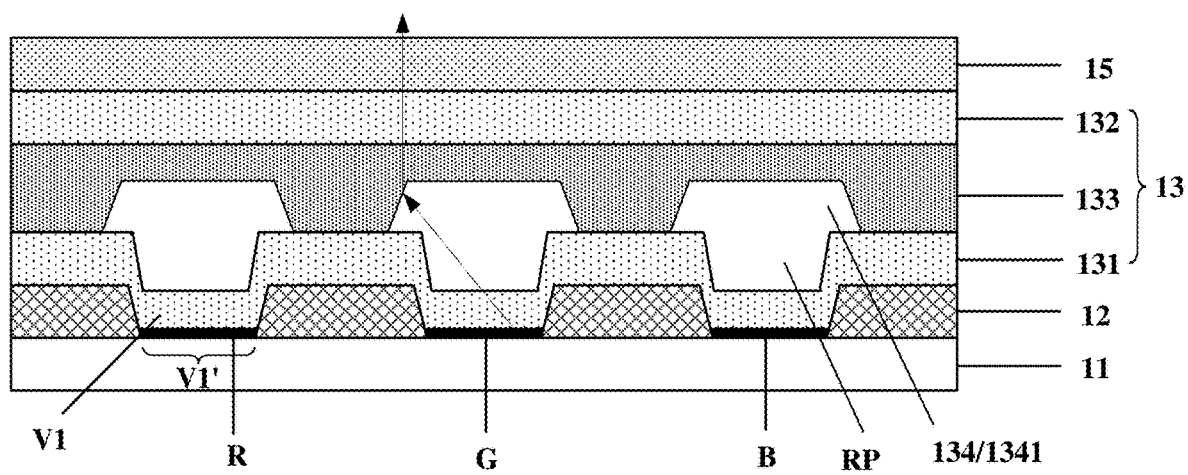

FIGS. 8A-8C are schematic structure views showing a display panel according to further embodiments of the present disclosure. In FIGS. 8A-8C, the arrows indicate the propagation directions of light.

As shown in FIGS. 8A-8C, the display panel comprises a base substrate 11, a pixel defining layer 12 and an encapsulation layer 13. In some embodiments, the display panel further comprises a module layer 15. For example, the module layer 15 comprises a touch layer, a polarizer layer, and a cover plate sequentially located on one side of the encapsulation layer 13 away from the base substrate 11.

For example, the base substrate 11 may be a glass substrate. For another example, the base substrate 11 may be a flexible substrate such as a PI substrate.

The pixel defining layer 12 is located on one side of the base substrate 11 and comprises a plurality of first openings V1 for defining a plurality of sub-pixels. Here, the plurality of first openings V1 is in one-to-one correspondence to the plurality of sub-pixels. For example, the plurality of sub-pixels comprises a red sub-pixel R, a green sub-pixel G and a blue sub-pixel B.

It should be understood that, the display panel may also comprise other components not shown in FIG. 8A, for example, a plurality of pixel driving circuits and a planarization layer covering the plurality of pixel driving circuits. The anode of each sub-pixel may be located on one side of the planarization layer away from the base substrate 11 and connected to a pixel driving circuit. The pixel defining layer 12 may be located on one side of the planarization layer and the anode away from the base substrate 11. Each first opening V1 of the pixel defining layer 12 exposes at least a part of an anode of a corresponding sub-pixel.

The encapsulation layer 13 is located on one side of the pixel defining layer 12 away from the base substrate 11. The encapsulation layer 13 comprises a first inorganic layer 131, a second inorganic layer 132, an organic layer 133, and at least one first optical structure 134. In some embodiments, the material of the first inorganic layer 131 comprises silicon oxynitride, and the material of the second inorganic layer 132 comprises silicon nitride.

The organic layer 133 is located between the first inorganic layer 131 and the second inorganic layer 132, and each first optical structure 134 is located between the first inorganic layer 131 and the organic layer 133.

The refractive index of each first optical structure 134 is greater than that of the organic layer 133. In some embodiments, the refractive index of each first optical structure 134 is 1.65 to 1.95, for example, 1.7, 1.8, 1.85 and so on. In some embodiments, the refractive index of the organic layer 133 is 1.4 to 1.6, for example, 1.5, 1.55 and so on.

In some embodiments, each first optical structure 134 comprises an organic body 1341. In some embodiments, the material of the body 1341 comprises an organic polymer. In some embodiments, the thickness of the body 1341 is 2 microns to 4 microns, for example, 2.5 microns, 3 microns, 3.5 microns, and so on.

In some embodiments, the cross-section of the first optical structure 134 may be in an inverted trapezoidal shape, a regular trapezoidal shape, or a rectangular shape.

Referring to FIG. 8A, the cross-section of the first optical structure 134 is in an inverted trapezoidal shape. In this case, since the refractive index of the first optical structure 134 is greater than that of the organic layer 133, some light will be totally reflected upon incidence on the interface between the first optical structure 134 and the organic layer 133, and the propagation direction of light after total reflection in the organic layer 133 is closer to the direction perpendicular to the base substrate 11 than the propagation direction of light in the first optical structure 134, thereby improving the front light-emitting effect of the display panel.

Referring to FIG. 8B, the cross-section of the first optical structure 134 is in a rectangular shape. In this case, since the refractive index of the first optical structure 134 is greater than that of the organic layer 133, the propagation direction of light in the organic layer 133 is closer to the direction perpendicular to the base substrate 11 than the propagation direction of light in the first optical structure 134, thereby improving the front light-emitting effect of the display panel.

Referring to FIG. 8C, the cross-section of the first optical structure 134 is in a regular trapezoidal shape. In this case, similarly to FIG. 8B, since the refractive index of the first optical structure 134 is greater than that of the organic layer 133, the propagation direction of light in the organic layer 133 is closer to the direction perpendicular to the base substrate 11 than the propagation direction of light in the first optical structure 134, thereby improving the front light-emitting effect of the display panel.

It should be noted that, although the first optical structures 134 in FIGS. 8A-8C are all located in the recess portion RP of one surface of the first inorganic layer 131 away from the base substrate 11, this is not restrictive. In some embodiments, the first optical structure 134 may be located in the region of the surface of the first inorganic layer 131 away from the base substrate 111 other than the recess portion RP. In some embodiments, the first optical structure 134 is integrally provided with the first inorganic layer 131. It can be understood that, similar to FIGS. 8A-8C, the first optical structure 134 is also helpful to improve the front light-emitting efficiency of the display panel.

In the above embodiments, the first optical structure 134 is provided between the first inorganic layer 131 and the organic layer 133. Such a structure helps to improve the front light-emitting efficiency of the display panel.

Figure 9:
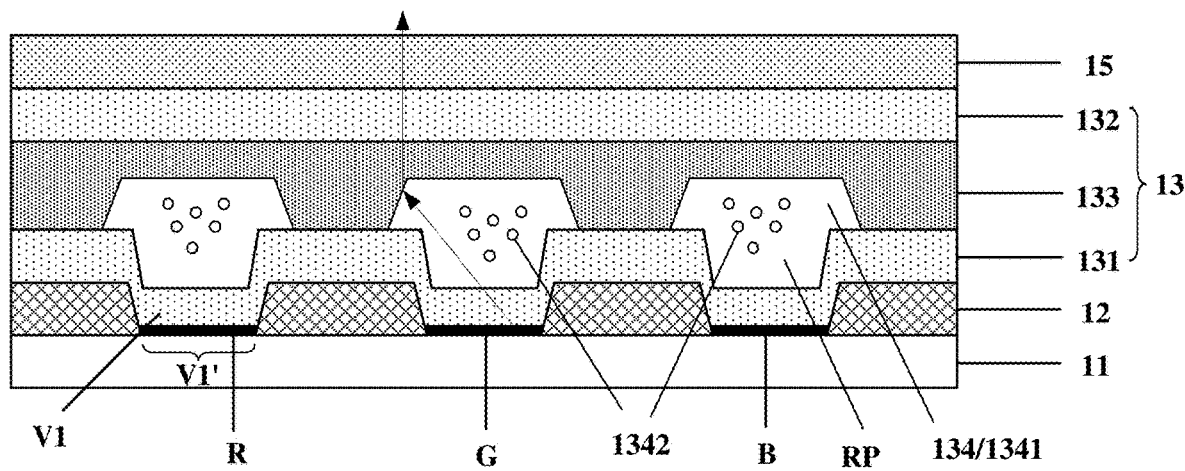
FIG. 9 is a schematic structure view showing a display panel according to still other embodiments of the present disclosure.

FIG. 9 is a schematic view showing the structure of a display panel according to still other embodiments of the present disclosure.

In some embodiments, as shown in FIG. 9, each first optical structure 134 further comprises an inorganic nanostructure 1342 located in the organic body 1341. In this way, it helps to improve the refractive index of the first optical structure 134, thereby further improving the front light-emitting efficiency of the display panel.

It should be noted that, FIG. 9 only shows the inorganic nanostructure 1342 located in the organic body 1341 with FIG. 8C as an example. It can be understood that, the organic body 1341 shown in FIGS. 8A and 8B may also be provided with an inorganic nanostructure 1342.

In some embodiments, the refractive index of the body 1341 is 1.5 to 1.6, and the refractive index of the nanostructure is 2 to 2.2. In this way, the refractive index of the first optical structure 134 can be in a proper range, which is more helpful to improve the front light-emitting efficiency of the display panel.

As some implementations, the nanostructure 1342 comprises at least one of a nanoparticle or a nanowire. For example, the nanostructure 1342 only comprises a nanoparticle. For another example, the nanostructure 1342 only comprises a nanowire. For still another example, the nanostructure 1342 comprises both a nanoparticle and a nanowire.

In some embodiments, the material of the nanostructure 1342 comprises at least one of zirconia or titania. For example, the nanostructure 1342 comprises nanoparticles of zirconia and nanoparticles of titania.

In some embodiments, each first optical structure 134 further comprises a photosensitizer. For example, the material of the photosensitizer comprises material that can be cured by ultraviolet light, for example, organic polymer material. In this way, it helps to cure the first optical structure 134.

Figure 10:
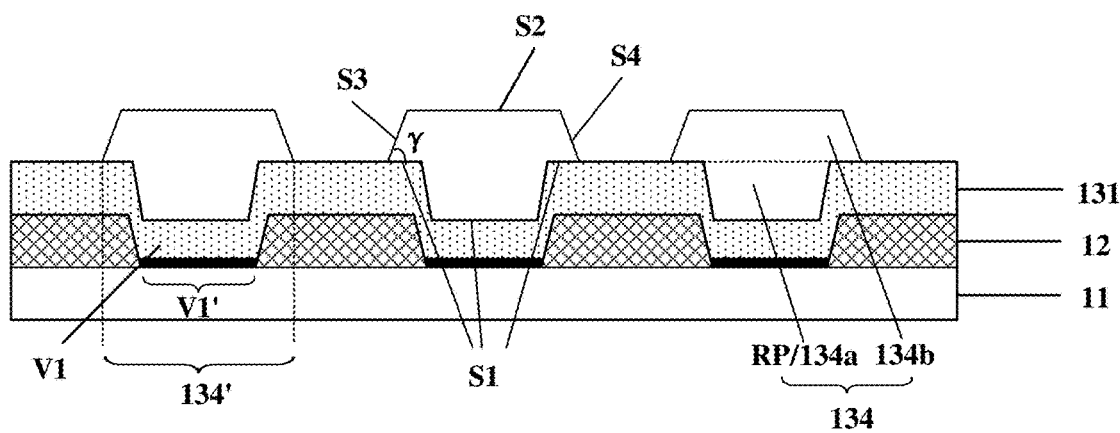
FIG. 10 is a partial schematic view of the display panel shown in FIG. 9.

FIG. 10 is a partial schematic view of the display panel shown in FIG. 9.

As shown in FIG. 10, in the cross-sectional view perpendicular to the base substrate 11, the first optical structure 134 comprises a first surface S1 and a second surface S2 arranged oppositely, and a third surface S3 and a fourth surface S4 arranged oppositely. In the first optical structure 134, the second surface S2 is located on one side of the first surface S1 away from the base substrate 11, and each of the third surface S3 and the fourth surface S4 is adjacent to the first surface S1 and the second surface S2. In some embodiments, at least one of the third surface S3 or the fourth surface S4 may be a curved surface.

In some embodiments, the comprised angle γ between each of the third surface S3 and the fourth surface S4 and the surface of the base substrate 11 is one of a first range and a second range. The first range is greater than or equal to 60 degrees, and smaller than or equal to 90 degrees, and the second range is greater than or equal to 100 degrees, and smaller than or equal to 120 degrees. That is, the comprised angle γ is greater than or equal to 60 degrees, and smaller than or equal to 90 degrees, or the comprised angle γ is greater than or equal to 100 degrees, and smaller than or equal to 120 degrees.

In the case where the comprised angle γ is within the first range or the second range described above, it helps to further improve the front light-emitting efficiency of the display panel.

In some embodiments, the second surface S2 of the first optical structure 134 is substantially parallel, that is, parallel within a process deviation range, to the surface of the base substrate 11. In other words, the second surface S2 of the first optical structure 134 is a plane that is parallel to the surface of the base substrate 11. In this way, the light emitted by a sub-pixel perpendicular to the base substrate 11 can be prevented from deviating from the direction perpendicular to the base substrate 11, which helps to further improve the front light-emitting efficiency of the display panel.

In some embodiments, referring to FIGS. 8C, 9 and 10, the surface of the first inorganic layer 131 away from the base substrate 11 has a plurality of recess portions RP in one-to-one correspondence to a plurality of first openings V1, each first optical structure 134 is in one-to-one correspondence to each recess portion RP, and each first optical structure 134 is at least partially located in a corresponding recess portion RP.

In some embodiments, referring to FIG. 10, each first optical structure 134 comprises a first portion 134a located in a corresponding recess portion RP and a second portion 134b outside the corresponding recess portion RP, and the orthographic projection of the first portion 134a on the base substrate 11 is within the orthographic projection of the second portion 134b on the base substrate 11.

As some implementations, the orthographic projection of the first portion 134a on the base substrate 11 completely coincides with the orthographic projection of the second portion 134b on the base substrate 11.

As other implementations, the area of the orthographic projection of the first portion 134a on the base substrate 11 is smaller than the area of the orthographic projection of the second portion 134b on the base substrate 11. In this way, it is more helpful to improve the front light-emitting efficiency of the display panel.

Hereinafter, the orthographic projection of each first optical structure 134 on the base substrate 11 is referred to as the fourth orthographic projection 134', the orthographic projection of the first opening V1 corresponding to each first optical structure 134 on the base substrate 11 is referred to as the first orthographic projection V1', and a region that the fourth orthographic projection 134' and the first orthographic projection V1' overlap with each other is referred to as a first region A1.

In some embodiments, at least one of the fourth orthographic projection 134' or the first orthographic projection V1' comprises a first region A1 and a second region A2 other than the first region A1. For example, the fourth orthographic projection 134' comprises a first region A1 overlapping with the first orthographic projection V1' and a second region A2 not overlapping with the first orthographic projection V1'. For another example, the first orthographic projection V1' comprises a first region A1 overlapping with the fourth orthographic projection 134' and a second region A2 not overlapping with the fourth orthographic projection 134'.

Figure 11A:
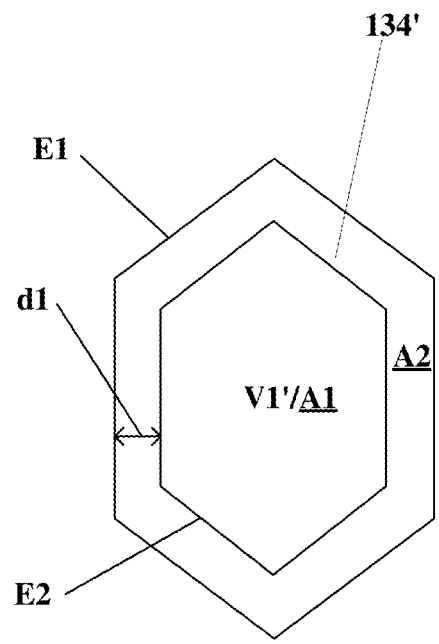
FIGS. 11A and 11B are schematic views showing a first orthographic projection and a third orthographic projection according to some embodiments of the present disclosure.
Figure 11B:
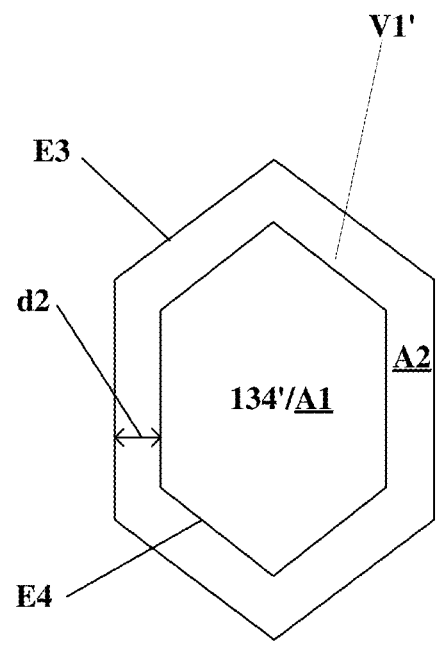

FIGS. 11A and 11B are schematic views showing a first orthographic projection and a third orthographic projection according to some embodiments of the present disclosure.

In some embodiments, as shown in FIG. 11A, the fourth orthographic projection 134' comprises a first region A1 overlapping with the first orthographic projection V1' and a second region A2 not overlapping with the first orthographic projection V1'. A part of the edge of the fourth orthogonal projection 134' overlapping with the second region A2 of the fourth orthogonal projection 134' is a first edge E1, and a part of the edge of the first orthogonal projection V1' overlapping with the first region A1 is a second edge E2. The minimum distance d1 between the first edge E1 and the second edge E2 is smaller than or equal to 3 microns. For example, d1 is 0, 1 micron, 2 microns, and so on.

In the above embodiments, the minimum distance d1 is smaller than or equal to 3 microns. In this way, it is more helpful to improve the front light-emitting efficiency of the display panel.

In other embodiments, as shown in FIG. 11B, the first orthographic projection V1' comprises a first region A1 overlapping with the fourth orthographic projection 134' and a second region A2 not overlapping with the fourth orthographic projection 134'. A part of the edge of the first orthographic projection V1' overlapping with the second region A2 of the first orthographic projection V1' is a third edge E3, and a part of the edge of the fourth orthographic projection 134' overlapping with the first region A1 is a fourth edge E4. The minimum distance d2 between the third edge E3 and the fourth edge E4 is smaller than or equal to 1 micron, for example, 0 micron, 0.5 micron, and so on.

In the above embodiments, the minimum distance d2 is smaller than or equal to 1 micron. In this way, it is more helpful to improve the front light-emitting efficiency of the display panel.

It should be noted that, although the first orthographic projection V1' shown in FIG. 11A is completely within the fourth orthographic projection 134' and the fourth orthographic projection 134' shown in FIG. 11B is completely within the first orthographic projection V1', this is not restrictive. In some embodiments, the first orthographic projection V1' may also be partially within the fourth orthographic projection 134', and partially outside the fourth orthographic projection 134'; and the fourth orthographic projection 134' may also be partially within the first orthographic projection V1' and partially outside the first orthographic projection V1'. In this case, the first orthographic projection V1' and the fourth orthographic projection 134' each comprise a second region A.

Figure 12A:
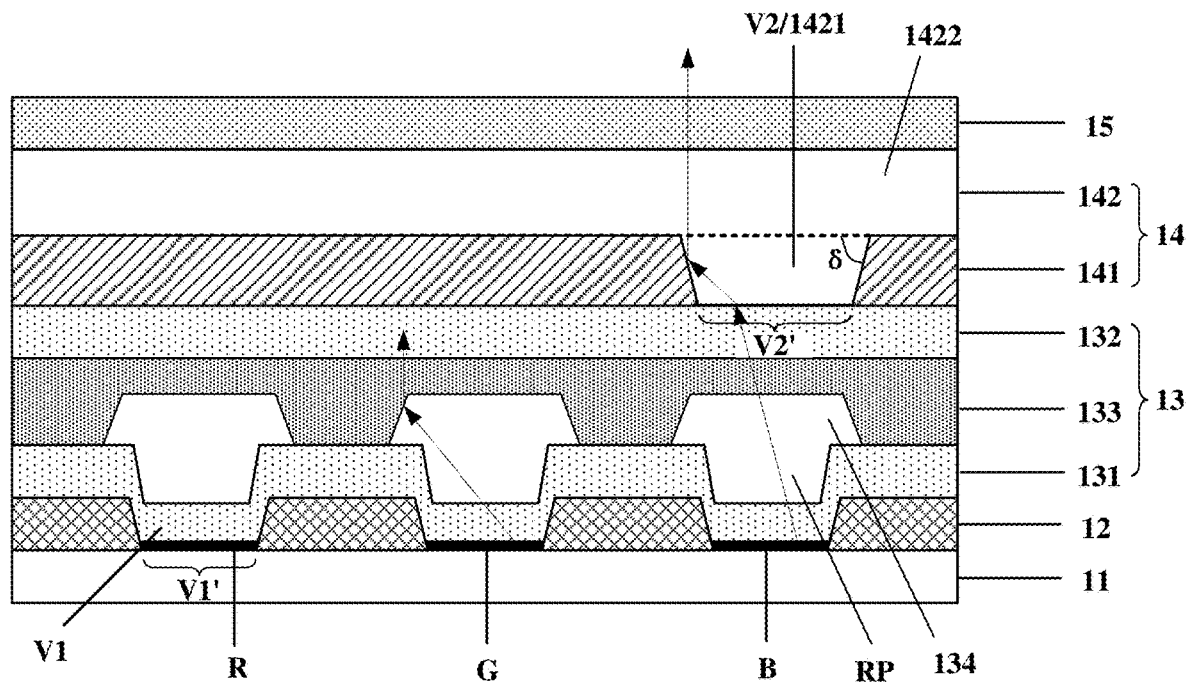
FIGS. 12A and 12B are schematic structure views showing a display panel according to yet some embodiments of the present disclosure.
Figure 12B:
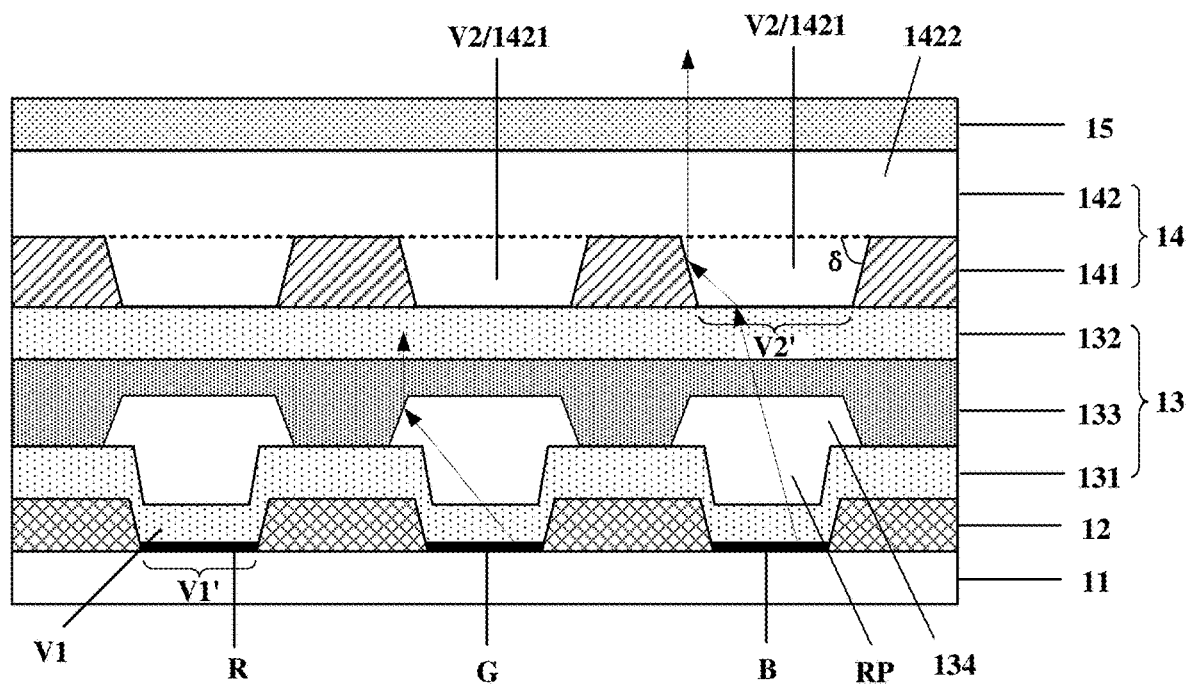

FIGS. 12A and 12B are schematic views showing the structure of a display panel according to yet some embodiments of the present disclosure.

Compared with the embodiment shown in FIG. 8C, the display panel shown in FIGS. 12A and 12B further comprises a first light modulation layer 14 located on one side of the encapsulation layer 13 away from the base substrate 11.

The first light modulation layer 14 comprises a first light modulation sub-layer 141 and a second light modulation sub-layer 142, and the refractive index of the second light modulation sub-layer 142 is greater than that of the first light modulation sub-layer 141.

The first light modulation sub-layer 141 comprises at least one second opening V2 in one-to-one correspondence to at least one sub-pixel. The second light modulation sub-layer 142 comprises a first light modulation portion 1421 located in each second opening V2. For example, referring to FIG. 12A, the first light modulation sub-layer 141 has only one second opening V2 corresponding to one sub-pixel. For another example, referring to FIG. 12B, the first light modulation sub-layer 141 has a plurality of second openings V2 in one-to-one correspondence to a plurality of sub-pixels.

The first light modulation layer 14 is configured such that light from each of at least one sub-pixel propagates along a direction away from the base substrate 11 after total reflection upon incidence on an interface between the first light modulation portion 1421 in a corresponding second opening V2 and the first light modulation sub-layer 141. For example, FIGS. 12A and 12B show that light from the blue sub-pixel B propagates along a direction perpendicular to the base substrate 11 after total reflection upon incidence on the interface between the first light modulation portion 1421 in a corresponding second opening V2 and the first light modulation sub-layer 141.

In the above embodiments, the display panel comprises both the first optical structure 134 and the first light modulation layer 14 at the same time. In this way, the front light-emitting efficiency of the display panel can be still further improved.

In some embodiments, the comprised angle δ between the surface of the first light modulation portion 1421 away from the base substrate 11 and the first light modulation sub-layer 141 is greater than or equal to 60 degrees, and smaller than or equal to 80 degrees. For example, δ is 65 degrees, 70 degrees, and so on. In this way, it helps to further improve the front light-emitting efficiency of the display panel.

In some embodiments, referring to FIGS. 12A and 12B, the second light modulation sub-layer 142 further comprises a portion 1422 located on one side of the first light modulation sub-layer 141 and the first light modulation portion 1421 away from the base substrate 11. For example, the refractive index of this portion 1422 is the same as that of the first light modulation portion 1421.

In some embodiments, the display panel shown in FIGS. 12A and 12B satisfies at least one of the first condition or the second condition described above, thus the front light-emitting efficiency of the display panel can be further improved.

For example, at least a part of the edge of the first orthogonal projection V1' of the first opening V1 corresponding to each of at least one sub-pixel of the display panel shown in FIGS. 12A and 12B on the base substrate 11 has a recess RS. For another example, at least a part of the edge of the second orthogonal projection V2' of the second opening V2 corresponding to each of at least one sub-pixel of the display panel shown in FIGS. 12A and 12B on the base substrate 11 has at least one of a recess RS or a protrusion PT. For still another example, at least a part of the interface between the first light modulation portion 1421 and the first light modulation sub-layer 141 is non-planar.

In some embodiments, each sub-pixel with both a corresponding first opening V1 and a corresponding second opening V2 at the same time in the display panel is a blue sub-pixel B, as shown in FIG. 12A. In other words, only the light emitted by the blue sub-pixel B propagates along the direction perpendicular to the base substrate 11 after total reflection upon incidence on the interface between the first light modulation portion 1421 in a corresponding second opening V2 and the first light modulation sub-layer 141; while the light emitted by the red sub-pixel R and the green sub-pixel G is directly incident on the first light modulation sub-layer 141 after passing through the encapsulation layer 13, rather than incident on the first light modulation portion 1421 first and then incident on the first light modulation sub-layer 141. In this way, both the light-emitting efficiency and the white-light color deviation of the display panel can be considered.

Figure 13A:
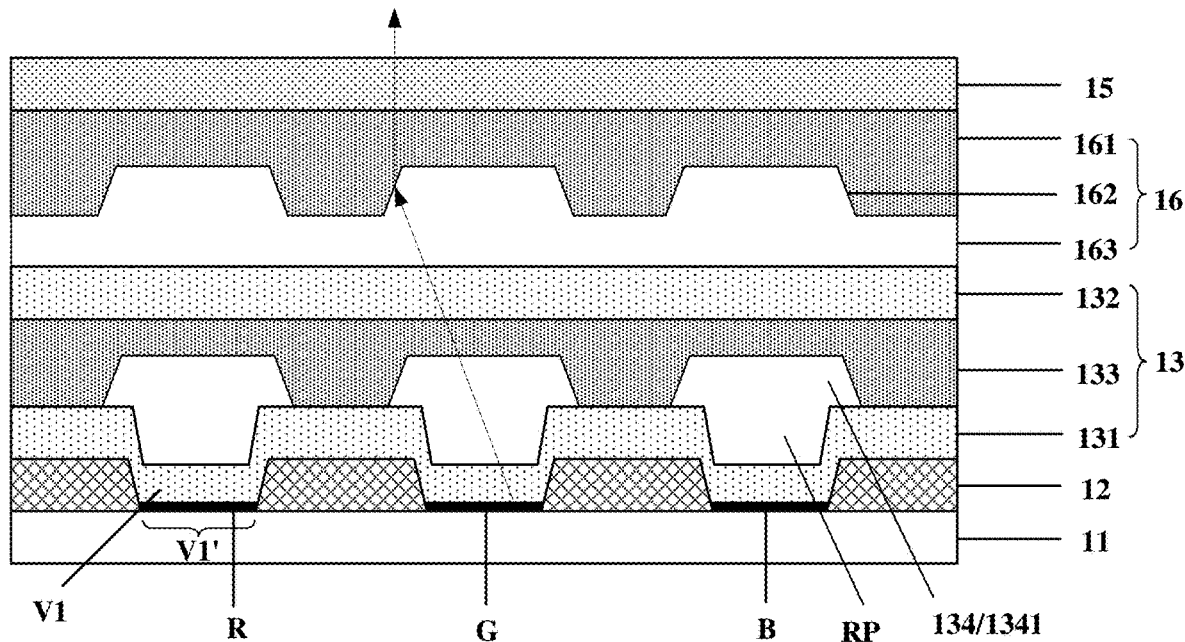
FIGS. 13A-13C are schematic structure views showing a display panel according to yet some embodiments of the present disclosure.
Figure 13B:
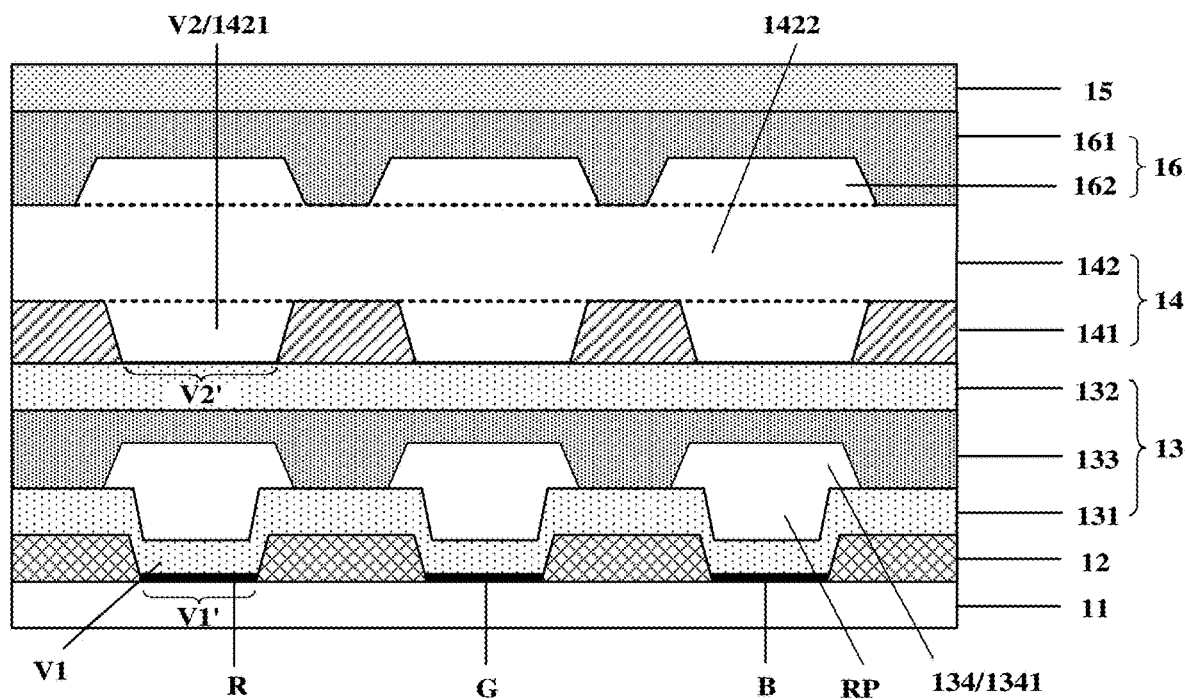
Figure 13C:
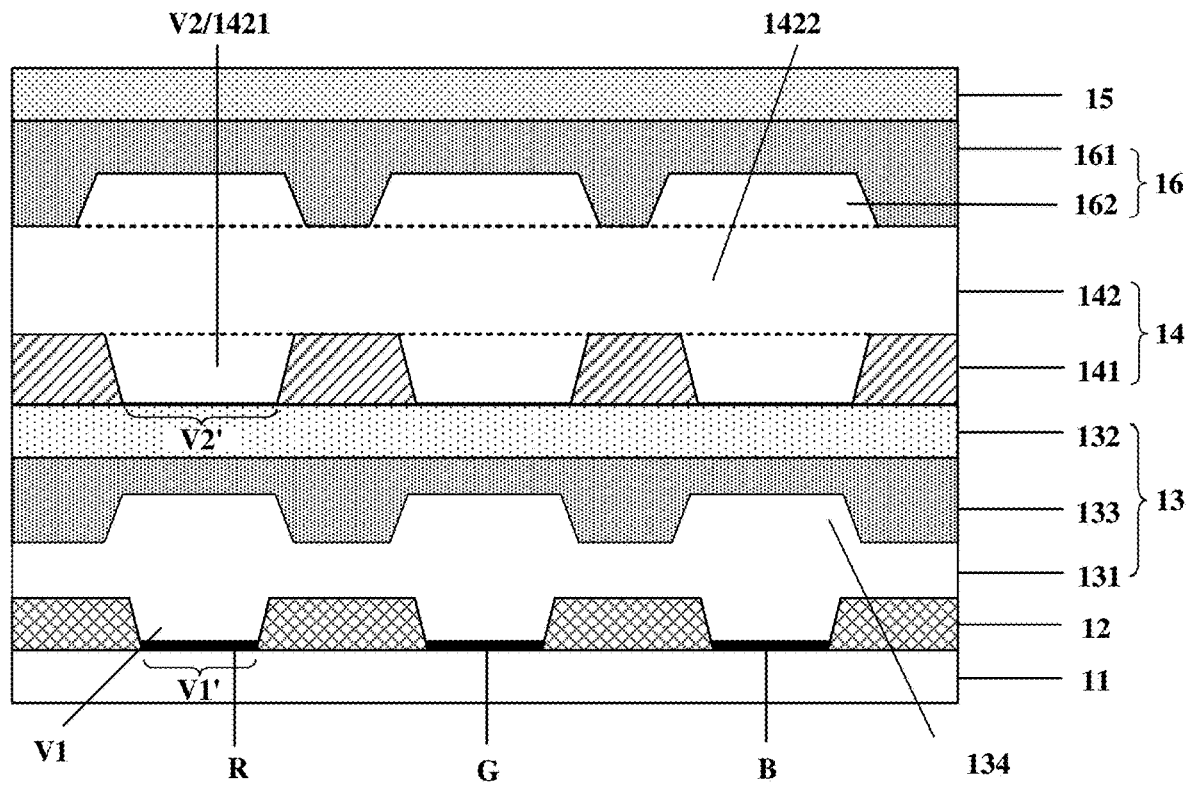

FIGS. 13A-13C are schematic views showing the structure of a display panel according to yet some embodiments of the present disclosure.

Compared with the embodiment shown in FIG. 8C, the display panel shown in FIGS. 13A-13C further comprises a second light modulation layer 16.

The second light modulation layer 16 is located on one side of the encapsulation layer 13 away from the base substrate 11. The second light modulation layer 16 comprises a fourth light modulation sub-layer 161 and at least one second optical structure 162. Each second optical structure 162 is located between the encapsulation layer 13 and the fourth light modulation sub-layer 161, and the refractive index of each second optical structure 162 is greater than that of the fourth light modulation sub-layer 161. In some embodiments, the orthographic projection of the second optical structure 162 on the base substrate at least partially overlaps with the first orthographic projection V1'.

In some embodiments, the second light modulation layer 16 further comprises a fifth light modulation sub-layer 163 located between the second optical structure 162 and the encapsulation layer 13.

As some implementations, the fifth light modulation sub-layer 163 is integrally provided with the second optical structure 162. For example, the material of each of the fifth light modulation sub-layer 163 and the second optical structure 162 is inorganic material. In some embodiments, the second optical structure 162 can be obtained by etching (for example, plasma etching) the fifth light modulation sub-layer 163.

As other implementations, the material of the fifth light modulation sub-layer 163 is an inorganic material, and the second optical structure 162 comprises an organic body.

It should be noted that, the above description concerning the first optical structure 134 applies to the second optical structure 162, which will not be described in detail here.

In some embodiments, referring to FIGS. 13B and 13C, the display panel comprises both the first light modulation layer 14 and the second light modulation layer 16 at the same time to further improve the front light-emitting efficiency of the display panel.

In some embodiments, referring to FIG. 13C, the first inorganic layer 131 is integrally provided with the first optical structure 134.

Figure 14:
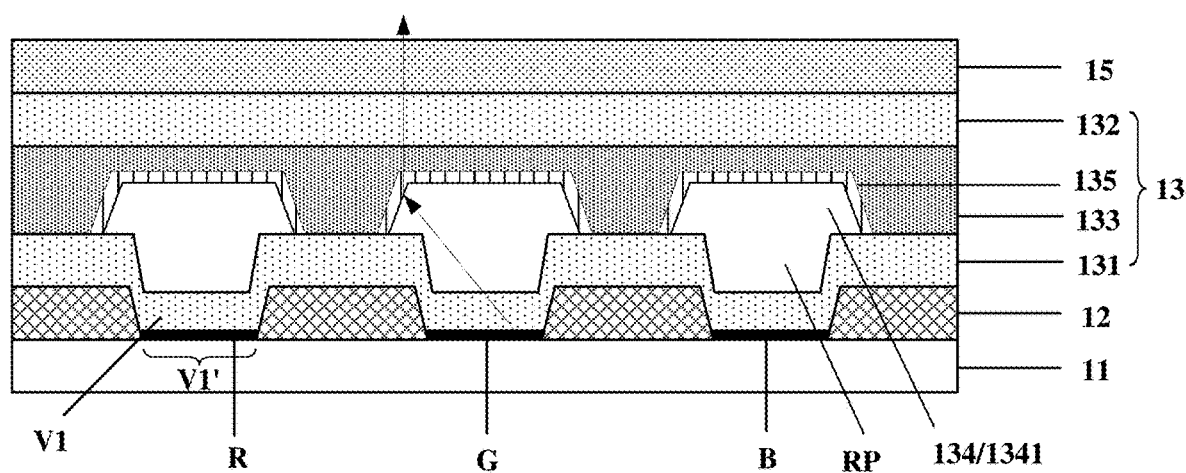
FIG. 14 is a schematic structure view showing a display panel according to still some embodiments of the present disclosure.

FIG. 14 is a schematic structure view showing a display panel according to still some embodiments of the present disclosure.

Compared with the embodiment shown in FIG. 8C, in the display panel shown in FIG. 14, the encapsulation layer 13 further comprises a third inorganic layer 135 in addition to the first inorganic layer 131, the second inorganic layer 132, the organic layer 133 and at least one first optical structure 134. The third inorganic layer 135 is located between the at least one first optical structure 134 and the organic layer 133. As some implementations, the material of the third inorganic layer 135 comprises oxide of silicon (for example, silicon oxide) or oxynitride of silicon (for example, silicon oxynitride).

In the above embodiments, the third inorganic layer 135 in the encapsulation layer 13 is conductive to improving the performance of the interface between the first optical structure 134 and the organic layer 133 to reduce the surface tension of the interface, thereby reducing the adverse impact of the interface on the display effect of the display panel.

In some embodiments, the first optical structure 134 is not in contact with the organic layer 133. In this way, the adverse effect of the interface between the first optical structure 134 and the organic layer 133 on the display effect of the display panel can be further reduced.

In some embodiments, the display panel with the first optical structure 134 may also reduce the white-light color deviation of the display panel in the manner shown in FIGS. 4A-4D, which will not be described in detail here.

In some embodiments, the display panel with the first optical structure 134 may also reduce the yellow-green-light color deviation of the display panel in the manner shown in FIGS. 7A-7C, which will not be described in detail here.

The manner of reducing the color deviation of the display panel according to some embodiments of the present disclosure will be described below in conjunction with FIGS. 15A and 15B.

Figure 15A:
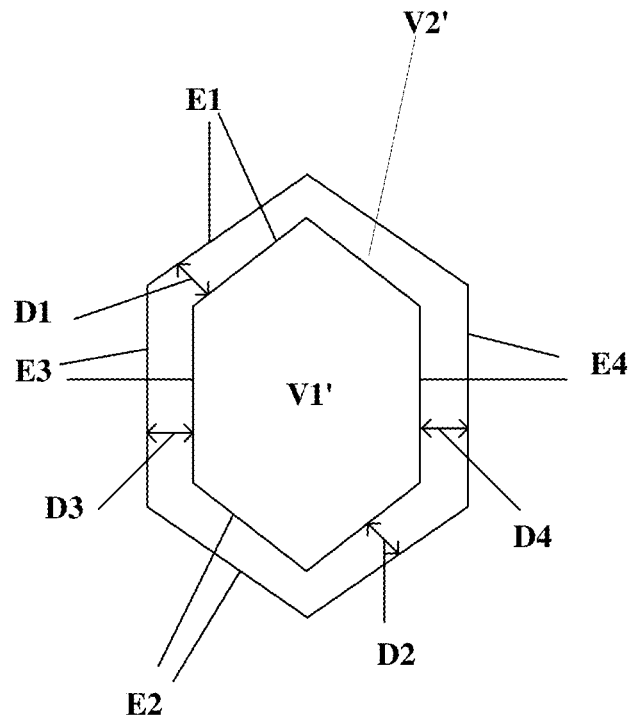
FIGS. 15A and 15B are schematic views showing a first orthographic projection and a second orthographic projection according to still other embodiments of the present disclosure.
Figure 15B:
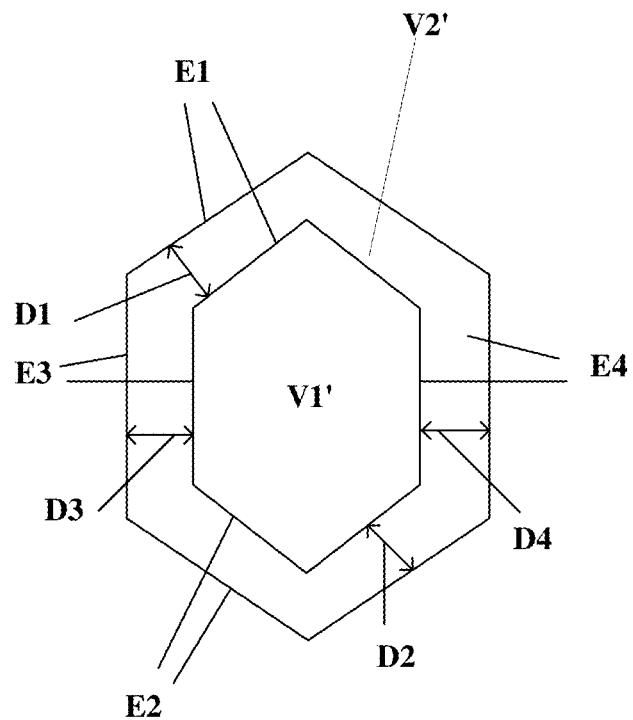

FIGS. 15A and 15B are schematic views showing a first orthographic projection and a second orthographic projection according to still other embodiments of the present disclosure.

For convenience of description, the distance between the first edge E1 of the first orthographic projection V1' corresponding to the red sub-pixel R and the first edge E1 of the second orthographic projection V2' corresponding to the red sub-pixel R is referred to as a first distance D1, and the distance between the second edge E2 of the first orthographic projection V1' corresponding to the red sub-pixel R and the second edge E2 of the second orthographic projection V2' corresponding to the red sub-pixel R is referred to as a second distance D2. The distance between the third edge E3 of the first orthographic projection V2' corresponding to the red sub-pixel R and the third edge E3 of the second orthographic projection V2' corresponding to the red sub-pixel R is referred to as a third distance D3, and the distance between the fourth edge E4 of the first orthographic projection V1' corresponding to the red sub-pixel R and the fourth edge E4 of the second orthographic projection V2' corresponding to the red sub-pixel R is referred to as a fourth distance D4.

The first distance D1, the second distance D2, the third distance D3 and the fourth distance D4 are the same in the case where the adjustment of the color deviation of the display panel is not considered.

In some embodiments, referring to FIG. 15A, at least one of the first distance D1 or the second distance D2 is decreased, and the third distance D3 and the fourth distance D4 are kept constant. For example, each of the first distance D1 and the second distance D2 is decreased from 2 microns to a value between 0.5 microns and 1.8 microns. In this way, the white-light color deviation of the display panel can be reduced.

In other embodiments, referring to FIG. 15B, at least one of the third distance D3 or the fourth distance D4 is increased, and the first distance D1 and the second distance D2 are kept constant. For example, each of the third distance D3 and the fourth distance D4 is increased from 2 microns to a value between 2.5 microns and 4 microns. In this way, the white-light color deviation of the display panel can be reduced.

The manner of reducing the color deviation of the display panel shown in FIG. 5A according to other embodiments of the present disclosure will be described below in conjunction with FIGS. 16A and 16B.

Figure 16A:
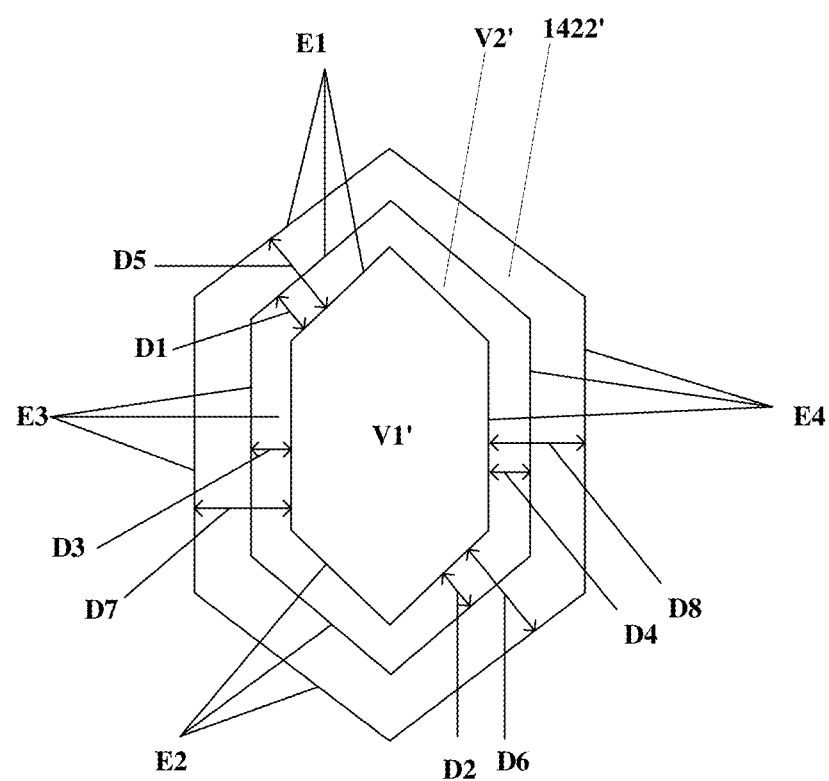
FIGS. 16A and 16B are schematic views showing a first orthographic projection, a second orthographic projection and a third orthographic projection according to further embodiments of the present disclosure.
Figure 16B:
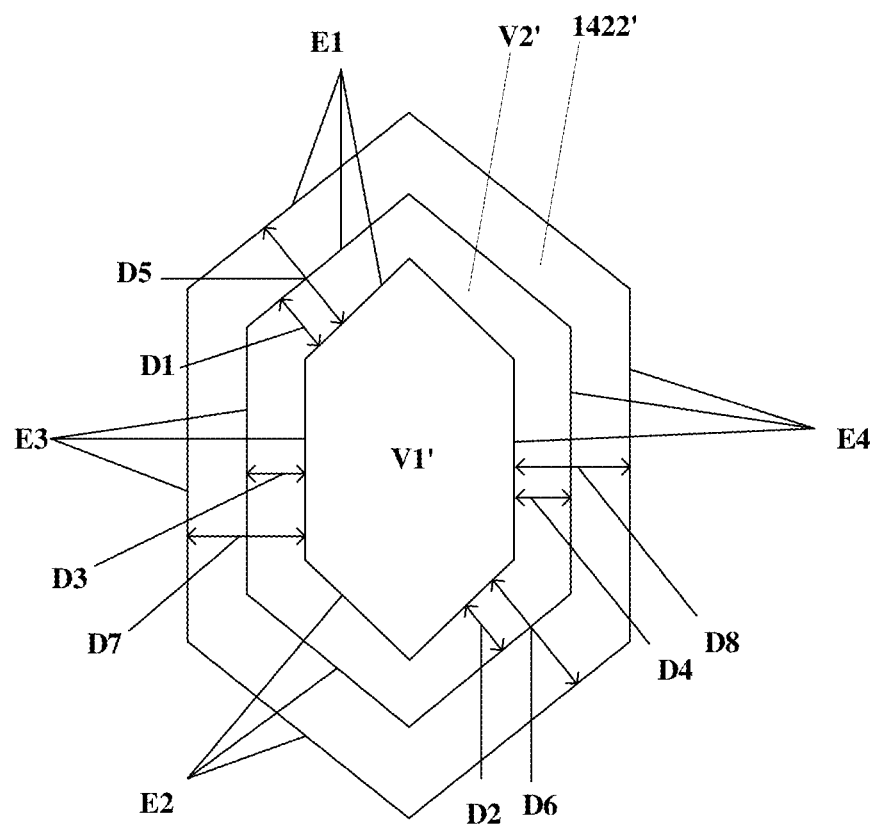

FIGS. 16A and 16B are schematic views showing a first orthographic projection, a second orthographic projection and a third orthographic projection according to further embodiments of the present disclosure.

For convenience of description, the distance between the first edge E1 of the first orthogonal projection V1' corresponding to the red sub-pixel R and the first edge E1 of the third orthogonal projection 1422' corresponding to the red sub-pixel R is referred to as a fifth distance D5, and the distance between the second edge E2 of the first orthogonal projection V1' corresponding to the red sub-pixel R and the second edge E2 of the third orthogonal projection 1422' corresponding to the red sub-pixel R is referred to as a sixth distance D6. The distance between the third edge E3 of the first orthographic projection V1' corresponding to the red sub-pixel R and the third edge E3 of the third orthographic projection 1422' corresponding to the red sub-pixel R is referred to as a seventh distance D7, and the distance between the fourth edge E4 of the first orthographic projection V1' corresponding to the red sub-pixel R and the fourth edge E4 of the third orthographic projection 1422' corresponding to the red sub-pixel R is referred to as an eighth distance D8.

In some embodiments, referring to FIG. 16A, at least one of the first distance D1, the second distance D2, the fifth distance D5 or the sixth distance D6 is decreased, and the third distance D3, the fourth distance D4, the seventh distance D7 and the eighth distance D8 are kept constant. For example, each of the first distance D1 and the second distance D2 is decreased from 2 microns to a vale between 0.5 microns and 1.8 microns, and each of the fifth distance D5 and the sixth distance D6 is decreased from 5.4 microns to a vale between 3.9 microns and 5.2 microns. In this way, the white-light color deviation of the display panel may be reduced.

In other embodiments, referring to FIG. 16B, at least one of the third distance D3, the fourth distance D4, the seventh distance D7 or the eighth distance D8 is increased, and the first distance D1, the second distance D2, the fifth distance D5 and the sixth distance D6 are kept constant. For example, each of the third distance D3 and the fourth distance D4 is increased from 2 microns to a value between 2.5 microns and 4 microns, and each of the seventh distance D7 and the eighth distance D8 is increased from 5.4 microns to a value between 5.9 microns and 7.4 microns. In this way, the white-light color deviation of the display panel can be reduced.

The manner of reducing the color deviation of the display panel according to further embodiments of the present disclosure will be described below in conjunction with FIG. 17.

Figure 17:
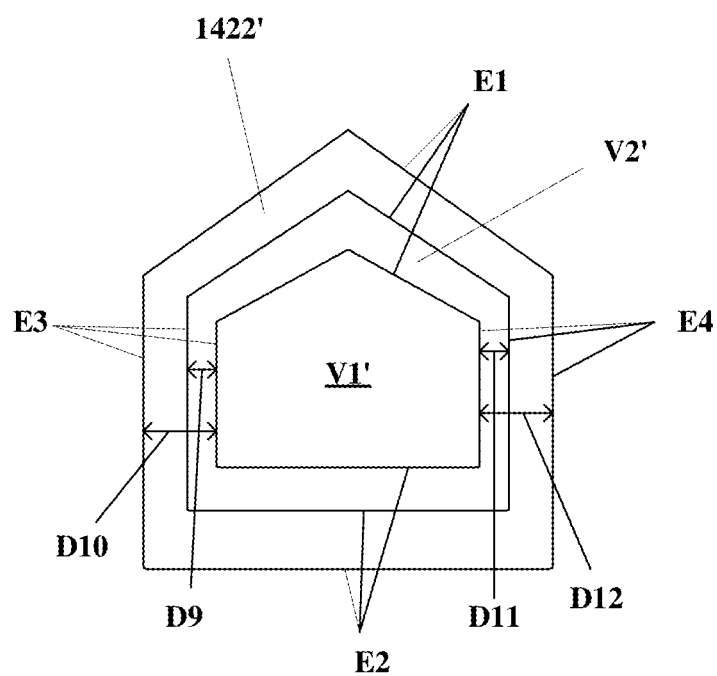
FIG. 17 is a schematic view showing a first orthogonal projection, a second orthogonal projection and a third orthogonal projection according to still other embodiments of the present disclosure.

FIG. 17 is a schematic view showing a first orthogonal projection, a second orthogonal projection and a third orthogonal projection according to still other embodiments of the present disclosure.

For convenience of description, the distance between the third edge E3 of the first orthogonal projection V1' corresponding to the green sub-pixel G and the third edge E3 of the second orthogonal projection V1' corresponding to the green sub-pixel G is referred to as a ninth distance D9, and the distance between the third edge E3 of the first orthogonal projection V1' corresponding to the green sub-pixel G and the third edge E3 of the third orthogonal projection 1422' corresponding to the green sub-pixel G is referred to as a tenth distance D10. The distance between the fourth edge E4 of the first orthographic projection V1' corresponding to the green sub-pixel G and the fourth edge E4 of the second orthographic projection V1' corresponding to the green sub-pixel G is referred to as an eleventh distance D11, and the distance between the fourth edge E4 of the first orthographic projection V1' corresponding to the green sub-pixel G and the fourth edge E4 of the third orthographic projection 1422' corresponding to the green sub-pixel G is referred to as a twelfth distance D12.

In some embodiments, referring to FIG. 17, at least one of the ninth distance D9, the tenth distance D10, the eleventh distance D11 or the twelfth distance D12 is decreased. For example, each of the ninth distance D9 and the eleventh distance D11 is decreased from 2 microns to a value between 0.5 microns and 1.8 microns, and each of the tenth distance D10 and the twelfth distance D12 is decreased from 5.4 microns to value between 3.9 microns and 5.2 microns. In this way, the yellow-green-light color deviation of the display panel can be reduced.

It should be noted that, the above solutions of reducing the color deviation of the display panel apply to the display panel according to any one of the embodiments of the present disclosure.

It should also be noted that, the display panels according to different embodiments of the present disclosure may be combined with each other to obtain more display panels.

Figure 18:
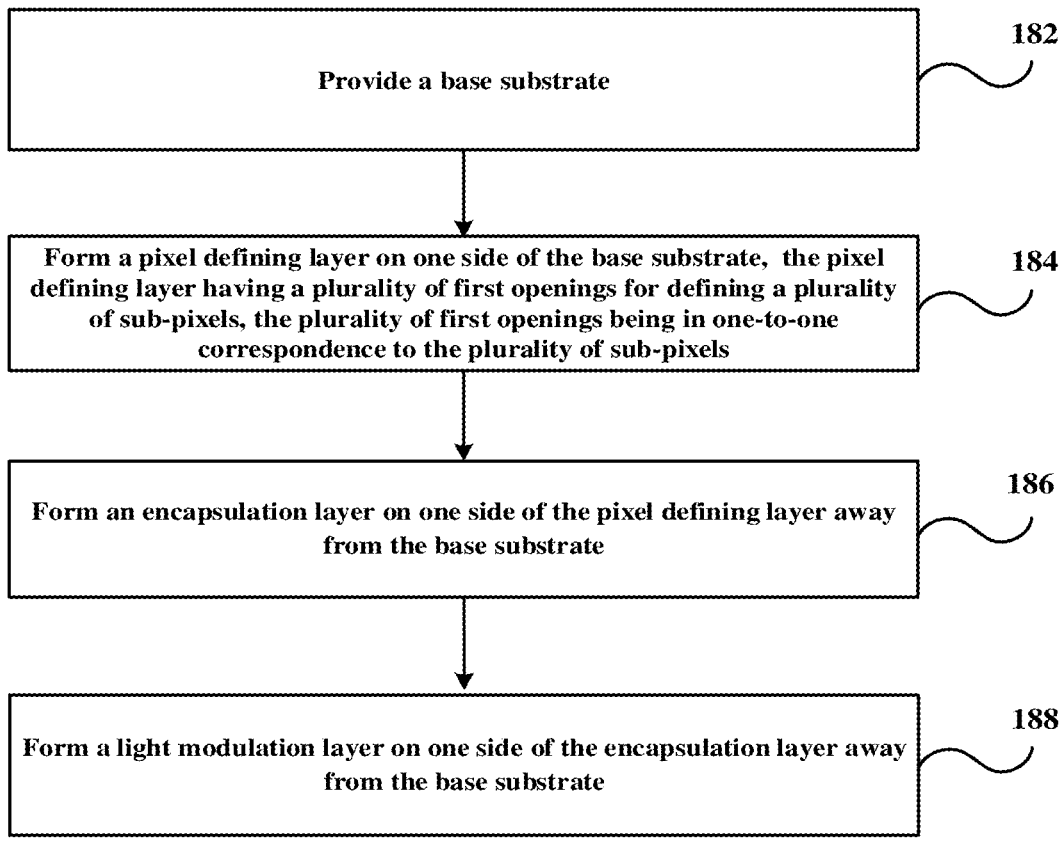
FIG. 18 is a flowchart showing a manufacturing method of a display panel embodiments of the present disclosure.

FIG. 18 is a flowchart showing a manufacturing method of a display panel according to some embodiments of the present disclosure.

At step 182, a base substrate is provided.

At step 184, a pixel defining layer is formed on one side of the base substrate. The pixel defining layer has a plurality of first openings for defining a plurality of sub-pixels, and the plurality of first openings is in one-to-one correspondence to the plurality of sub-pixels.

At step 186, an encapsulation layer is formed on one side of the pixel defining layer away from the base substrate.

At step 188, a light modulation layer is formed on one side of the encapsulation layer away from the base substrate.

First, a first light modulation sub-layer is formed. The first light modulation sub-layer has at least one second opening in correspondence to at least one sub-pixel. The orthographic projections of a corresponding first opening and a corresponding second opening of each of the at least one sub-pixel on the base substrate are a first orthographic projection and a second orthographic projection respectively.

Then, a second light modulation sub-layer is formed. The second light modulation sub-layer comprises a first light modulation portion located in each second opening.

Here, the light modulation layer is configured such that the light from each of at least one sub-pixel propagates to one side away from the base substrate after total reflection upon incidence on an interface between the first light modulation portion in a corresponding second opening and the first light modulation sub-layer.

The formed display panel satisfies at least one of a first condition or a second condition. The first condition is that: at least a part of the edge of the first orthographic projection has at least one of a recess or a protrusion PT. The second condition is that: at least a part of the edge of the second orthogonal projection has a recess.

The display panel formed in the above embodiments satisfies at least one of the first condition or the second condition. Such a structure helps to improve the front light-emitting efficiency of the display panel.

Figure 19:
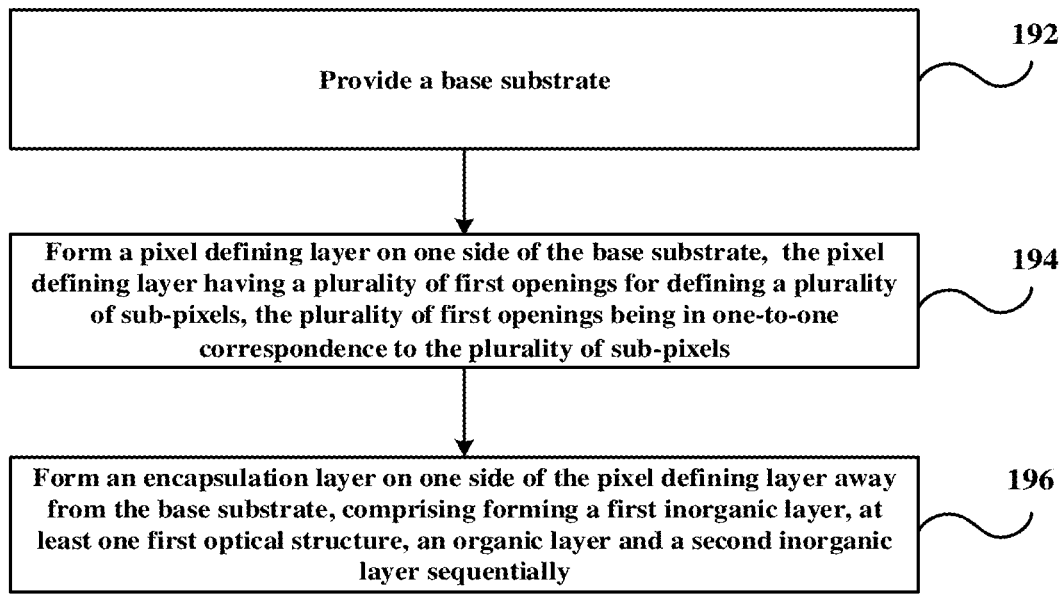
FIG. 19 is a flowchart showing a manufacturing method of a display panel according to other embodiments of the present disclosure.

FIG. 19 is a flowchart showing a manufacturing method of a display panel according to other embodiments of the present disclosure.

At step 192, a base substrate is provided.

At step 194, a pixel defining layer is formed on one side of the base substrate. The pixel defining layer has a plurality of first openings for defining a plurality of sub-pixels, and the plurality of first openings is in one-to-one correspondence to the plurality of sub-pixels.

At step 196, an encapsulation layer is formed on one side of the pixel defining layer away from the base substrate. In the step 196, a first inorganic layer, at least one first optical structure, an organic layer and a second inorganic layer are sequentially formed.

The second inorganic layer is located on one side of the first inorganic layer away from the base substrate, and the organic layer is located between the first inorganic layer and the second inorganic layer.

At least one first optical structure is located between the first inorganic layer and the organic layer, and the refractive index of each first optical structure is greater than that of the organic layer.

In the display panel formed in the above embodiments, the first optical structure is provided between the first inorganic layer and the organic layer. Such a structure helps to improve the front light-emitting efficiency of the display panel.

It should be noted that the recess and the protrusion mentioned in the embodiments of the present disclosure may be obtained by patterning a corresponding material layer by a patterned mask. For example, the mask has a recess or protrusion, so that the patterned material layer has a corresponding recess or protrusion.

In some embodiments, the display panel provided in the embodiments of the present disclosure is an OLED display panel.

The present disclosure also provides a display device, which may comprise the display panel according to any one of the above embodiments. In some embodiments, the display device may be any product or member having a display function, for example a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
    a base substrate;
    a pixel defining layer located on one side of the base substrate and having a plurality of first openings for defining a plurality of sub-pixels, wherein the plurality of first openings is in one-to-one correspondence to the plurality of sub-pixels;
    an encapsulation layer located on one side of the pixel defining layer away from the base substrate; and
    a light modulation layer located on one side of the encapsulation layer away from the base substrate, and comprising:
        a first light modulation sub-layer having at least one second opening in one-to-one correspondence to at least one sub-pixel of the plurality of sub-pixels, wherein orthographic projections of a first opening and a second opening which correspond to each of the at least one sub-pixel on the base substrate are a first orthographic projection and a second orthographic projection respectively,
        a second light modulation sub-layer comprising a first light modulation portion located in each of the at least one second opening, and a second light modulation portion, the second light modulation portion being located on one side of the first light modulation portion and the first light modulation sub-layer away from the base substrate, and adjacent to the first light modulation portion, wherein each of the first light modulation portion and the second light modulation portion comprises a first surface and a second surface arranged oppositely, and a third surface and a fourth surface arranged oppositely, the second surface is located on one side of the first surface away from the base substrate, each of the third surface and the fourth surface is adjacent to the first surface and the second surface, and a first comprised angle between each of the third surface and the fourth surface of the second light modulation portion and the first surface of the second light modulation portion is smaller than 90 degrees; and a third light modulation sub-layer located on one side of the first light modulation sub-layer and the second light modulation sub-layer away from the base substrate, wherein a refractive index of the third light modulation sub-layer is smaller than a refractive index of the second light modulation portion;

wherein the light modulation layer is configured such that light from each of the at least one sub-pixel propagates along a direction away from the base substrate after total reflection upon incidence on an interface between the first light modulation portion in the second opening corresponding to each of the at least one sub-pixel and the first light modulation sub-layer;

wherein the display panel satisfies at least one of a first condition or a second condition, wherein:

the first condition is that at least a part of an edge of the first orthogonal projection has a recess, and the second condition is that at least a part of an edge of the second orthogonal projection has at least one of a recess or a protrusion, or at least a part of the interface is non-planar.

2. The display panel according to claim 1, wherein the at least one sub-pixel comprises a blue sub-pixel.

3. The display panel according to claim 1, wherein:

the at least one sub-pixel comprises a first sub-pixel, wherein a length of the first sub-pixel along a first direction is greater than a length of the first sub-pixel along a second direction perpendicular to the first direction; and an edge of each of the first orthographic projection and the second orthographic projection corresponding to each of the at least one sub-pixel comprises a first edge and a second edge arranged oppositely along the first direction, and a third edge and a fourth edge arranged oppositely along the second direction, wherein each of the third edge and the fourth edge is adjacent to the first edge and the second edge.

4. The display panel according to claim 3, wherein at least one of the first edge or the second edge of the first orthographic projection of the first sub-pixel has a recess, and the third edge and the fourth edge of the first orthographic projection of the first sub-pixel have no recess.

5. The display panel according to claim 4, wherein at least one of the third edge or the fourth edge of the first orthogonal projection of the first sub-pixel has a protrusion.

6. The display panel according to claim 4, wherein:

at least one of the first edge or the second edge of the second orthogonal projection of the first sub-pixel has a recess; and/or at least one of the third edge or the fourth edge of the second orthogonal projection of the first sub-pixel has a protrusion.

7. The display panel according to claim 4, wherein an edge of the second orthogonal projection of the first sub-pixel has no recess and has no protrusion.

8. The display panel according to claim 3, wherein:

an edge of the first orthographic projection of the first sub-pixel has no recess and has no protrusion, and at least one of the first edge or the second edge of the second orthographic projection of the first sub-pixel has a recess; and/or an edge of the first orthographic projection of the first sub-pixel has no recess and has no protrusion, and at least one of the third edge or the fourth edge of the second orthographic projection of the first sub-pixel has a protrusion.

9. The display panel according to claim 3, wherein the plurality of sub-pixels comprises the first sub-pixel, a second sub-pixel and a third sub-pixel configured to emit light of different colors, and a ratio of the length of the first sub-pixel along the first direction to the length of the first sub-pixel along the second direction is greater than a ratio of a length of the second sub-pixel along the first direction to a length of the second sub-pixel along the second direction, and greater than a ratio of a length of the third sub-pixel along the first direction to a length of the third sub-pixel along the second direction.

10. The display panel according to claim 9, wherein the first sub-pixel is a red sub-pixel.

11. The display panel according to claim 1, wherein the first comprised angle is greater than or equal to 60 degrees.

12. The display panel according to claim 1, wherein a supplementary angle of a second comprised angle between each of the third surface and the fourth surface of the first light modulation portion and the first surface of the first light modulation portion is greater than or equal to 60 degrees, and smaller than or equal to 80 degrees.

13. The display panel according to claim 1, wherein:

the at least one sub-pixel comprises a first sub-pixel, wherein a length of the first sub-pixel along a first direction is greater than a length of the first sub-pixel along a second direction perpendicular to the first direction, and an orthographic projection of the second light modulation portion corresponding to each of the at least one sub-pixel on the base substrate is a third orthographic projection;

an edge of each of the first orthographic projection, the second orthographic projection and the third orthographic projection corresponding to each of the at least one sub-pixel comprises a first edge and a second edge arranged oppositely along the first direction, and a third edge and a fourth edge arranged oppositely along the second direction, wherein each of the third edge and the fourth edge is adjacent to the first edge and the second edge, and at least one of the first edge or the second edge of the first orthographic projection corresponding to the first sub-pixel has a recess.

14. The display panel according to claim 13, wherein the at least one sub-pixel further comprises a green sub-pixel, and at least one of the third edge or the fourth edge of the first orthogonal projection corresponding to the green sub-pixel has a recess.

15. The display panel according to claim 14, wherein:

at least one of the third edge or the fourth edge of the second orthogonal projection corresponding to the green sub-pixel has a recess; and/or at least one of the third edge or the fourth edge of the third orthogonal projection corresponding to the green sub-pixel has a recess.

16. The display panel according to claim 1, wherein the encapsulation layer comprises:

a first inorganic layer, wherein a surface of the first inorganic layer away from the base substrate has a plurality of recess portions in one-to-one correspondence to the plurality of first openings;

a second inorganic layer located on one side of the first inorganic layer away from the base substrate;

an organic layer located between the first inorganic layer and the second inorganic layer; and at least one first optical structure located between the first inorganic layer and the organic layer, wherein a refractive index of each of the at least one first optical structure is greater than a refractive index of the organic layer.

17. A display device, comprising the display panel according to claim 1.

18. A manufacturing method of a display panel, comprising:
providing a base substrate;
forming a pixel defining layer on one side of the base substrate, wherein the pixel defining layer has a plurality of first openings for defining a plurality of sub-pixels, and the plurality of first openings is in one-to-one correspondence to the plurality of sub-pixels;
forming an encapsulation layer on one side of the pixel defining layer away from the base substrate; and
forming a light modulation layer on one side of the encapsulation layer away from the base substrate, comprising:
forming a first light modulation sub-layer, wherein the first light modulation sub-layer has at least one second opening in one-to-one correspondence to at least one sub-pixel of the plurality of sub-pixels, and orthographic projections of a first opening and a second opening which correspond to each of the at least one sub-pixel on the base substrate are a first orthographic projection and a second orthographic projection respectively, and
forming a second light modulation sub-layer comprising a first light modulation portion located in each of the at least one second opening, and a second light modulation portion, the second light modulation portion being located on one side of the first light modulation portion and the first light modulation sub-layer away from the base substrate, and adjacent to the first light modulation portion, wherein each of the first light modulation portion and the second light modulation portion comprises a first surface and a second surface arranged oppositely, and a third surface and a fourth surface arranged oppositely, the second surface is located on one side of the first surface away from the base substrate, each of the third surface and the fourth surface is adjacent to the first surface and the second surface, and a first comprised angle between each of the third surface and the fourth surface of the second light modulation portion and the first surface of the second light modulation portion is smaller than 90 degrees; and
forming a third light modulation sub-layer located on one side of the first light modulation sub-layer and the second light modulation sub-layer away from the base substrate, wherein a refractive index of the third light modulation sub-layer is smaller than a refractive index of the second light modulation portion,
wherein the light modulation layer is configured such that light from each of the at least one sub-pixel propagates along a side away from the base substrate after total reflection upon incidence on an interface between the first light modulation portion in the second opening corresponding to each of the at least one sub-pixel and the first light modulation sub-layer;
wherein the display panel satisfies at least one of a first condition or a second condition, wherein:
the first condition is that at least a part of an edge of the first orthogonal projection has a recess, and
the second condition is that at least a part of an edge of the second orthogonal projection has at least one of a recess or a protrusion, or at least a part of the interface is non-planar.

19. A display panel, comprising:
a base substrate;
a pixel defining layer located on one side of the base substrate and having a plurality of first openings for defining a plurality of sub-pixels, wherein the plurality of first openings is in one-to-one correspondence to the plurality of sub-pixels, the plurality of sub-pixels comprises a first sub-pixel, a second sub-pixel and a third sub-pixel configured to emit light of different colors, a length of the first sub-pixel along a first direction is greater than a length of the first sub-pixel along a second direction perpendicular to the first direction, and a ratio of the length of the first sub-pixel along the first direction to the length of the first sub-pixel along the second direction is greater than a ratio of a length of the second sub-pixel along the first direction to a length of the second sub-pixel along the second direction, and greater than a ratio of a length of the third sub-pixel along the first direction to a length of the third sub-pixel along the second direction;
an encapsulation layer located on one side of the pixel defining layer away from the base substrate; and
a light modulation layer located on one side of the encapsulation layer away from the base substrate, and comprising:
a first light modulation sub-layer having at least one second opening in one-to-one correspondence to at least one sub-pixel of the plurality of sub-pixels, wherein the at least one sub-pixel comprises the first sub-pixel, and orthographic projections of a first opening and a second opening which correspond to each of the at least one sub-pixel on the base substrate are a first orthographic projection and a second orthographic projection respectively, and
a second light modulation sub-layer comprising a first light modulation portion located in each of the at least one second opening,
wherein the light modulation layer is configured such that light from each of the at least one sub-pixel propagates along a direction away from the base substrate after total reflection upon incidence on an interface between the first light modulation portion in the second opening corresponding to each of the at least one sub-pixel and the first light modulation sub-layer;
wherein the display panel satisfies at least one of a first condition or a second condition, wherein:
the first condition is that at least a part of an edge of the first orthogonal projection has a recess, and
the second condition is that at least a part of an edge of the second orthogonal projection has at least one of a recess or a protrusion.

* * * * *